(12) United States Patent
Wang et al.

(10) Patent No.: US 10,504,727 B2
(45) Date of Patent: Dec. 10, 2019

(54) THICK TUNGSTEN HARDMASK FILMS DEPOSITION ON HIGH COMPRESSIVE/TENSILE BOW WAFERS

(71) Applicant: Applied Materials, Inc., Santa Clara, CA (US)

(72) Inventors: Jiarui Wang, Santa Clara, CA (US); Prashant Kumar Kulshreshtha, San Jose, CA (US); Eswaranand Venkatasubramanian, Santa Clara, CA (US); Susmit Singha Roy, Mountain View, CA (US); Kwangduk Douglas Lee, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 94 days.

(21) Appl. No.: 15/695,180

(22) Filed: Sep. 5, 2017

(65) Prior Publication Data

US 2018/0076032 A1 Mar. 15, 2018

Related U.S. Application Data

(60) Provisional application No. 62/393,956, filed on Sep. 13, 2016.

(51) Int. Cl.
*H01L 21/311* (2006.01)
*H01L 21/033* (2006.01)
(Continued)

(52) U.S. Cl.
CPC ........ *H01L 21/0332* (2013.01); *C23C 16/342* (2013.01); *C23C 16/345* (2013.01);
(Continued)

(58) Field of Classification Search
CPC ................................. H01L 21/31144
See application file for complete search history.

(56) References Cited

U.S. PATENT DOCUMENTS 5,821,169 A    10/1998   Nguyen et al.
6,162,715 A * 12/2000   Mak ............... C23C 16/0245
                                                      257/E21.2
(Continued)

FOREIGN PATENT DOCUMENTS

KR    10-2011-0088984    8/2011

OTHER PUBLICATIONS

International Search Report and Written Opinion for International Application No. PCT/US2017/050105 dated Sep. 5, 2017.
(Continued)

*Primary Examiner* — Peniel M Gumedzoe
*Assistant Examiner* — Christopher A Johnson
(74) *Attorney, Agent, or Firm* — Patterson + Sheridan LLP

(57) ABSTRACT

Implementations of the present disclosure generally relate to the fabrication of integrated circuits. More particularly, the implementations described herein provide techniques for deposition of thick hardmask films on a substrate. In one implementation, a method of forming a hardmask layer on a substrate is provided. The method comprises applying a chucking voltage to a substrate positioned on an electrostatic chuck in a processing chamber, forming a seed layer comprising boron on a film stack disposed on a substrate by supplying a seed layer gas mixture in the processing chamber while maintaining the chucking voltage, forming a transition layer comprising boron and tungsten on the seed layer by supplying a transition layer gas mixture in the processing chamber and forming a bulk hardmask layer on
(Continued)

the transition layer by supplying a main deposition gas mixture in the processing chamber.

20 Claims, 8 Drawing Sheets

(51) Int. Cl.
    *C23C 16/34*     (2006.01)
    *C23C 16/40*     (2006.01)
    *C23C 16/50*     (2006.01)
    *H01L 21/02*     (2006.01)
    *H01L 27/11556*     (2017.01)
    *H01L 27/11582*     (2017.01)
    *H01L 21/683*     (2006.01)

(52) U.S. Cl.
    CPC ............ *C23C 16/401* (2013.01); *C23C 16/50* (2013.01); *H01L 21/0217* (2013.01); *H01L 21/02112* (2013.01); *H01L 21/02164* (2013.01); *H01L 21/02205* (2013.01); *H01L 21/02274* (2013.01); *H01L 21/0337* (2013.01); *H01L 27/11556* (2013.01); *H01L 27/11582* (2013.01); *H01L 21/6831* (2013.01)

(56) References Cited

U.S. PATENT DOCUMENTS

| | | | |
|---|---|---|---|
| 6,198,616 | B1 | 3/2001 | Dahimene et al. |
| 7,659,197 | B1 | 2/2010 | Juliano |
| 8,110,493 | B1 | 2/2012 | Subramonium et al. |
| 8,288,289 | B2 | 10/2012 | Jeong et al. |
| 9,536,734 | B2 | 1/2017 | Hanashima et al. |
| 2006/0009024 | A1 | 1/2006 | Lee |
| 2006/0024948 | A1 | 2/2006 | Oh et al. |
| 2007/0026685 | A1 | 2/2007 | Bae et al. |
| 2007/0231010 | A1 | 10/2007 | Ohta et al. |
| 2009/0263972 | A1* | 10/2009 | Balseanu ............ H01L 21/3086 438/696 |
| 2010/0317177 | A1 | 12/2010 | Huang et al. |
| 2012/0264306 | A1 | 10/2012 | Wu et al. |
| 2014/0154883 | A1* | 6/2014 | Humayun ......... H01L 21/67207 438/675 |
| 2015/0056805 | A1* | 2/2015 | Park .................. H01L 21/76804 438/672 |
| 2015/0228474 | A1 | 8/2015 | Hanashima et al. |
| 2015/0318294 | A1 | 11/2015 | Wang |
| 2016/0035569 | A1 | 2/2016 | Rumer et al. |
| 2016/0049323 | A1* | 2/2016 | Ye ....................... H01L 21/6833 361/234 |
| 2016/0155627 | A1 | 6/2016 | Hanashima et al. |
| 2017/0249211 | A1* | 8/2017 | Hoei ..................... G06F 3/0619 |

OTHER PUBLICATIONS

Search Report for Taiwan Application No. 106129903 dated May 13, 2019.

* cited by examiner

of thick hardmask films on a substrate.

THICK TUNGSTEN HARDMASK FILMS DEPOSITION ON HIGH COMPRESSIVE/TENSILE BOW WAFERS

CROSS-REFERENCE TO RELATED APPLICATIONS

This application claims benefit of U.S. Provisional Patent Application Ser. No. 62/393,956, filed Sep. 13, 2016, which is incorporated herein by reference in its entirety.

BACKGROUND

Field

Implementations of the present disclosure generally relate to the fabrication of integrated circuits. More particularly, the implementations described herein provide techniques for deposition of thick hardmask films on a substrate.

Description of the Related Art

Plasma enhanced processes, such as plasma enhanced chemical vapor deposition (PECVD) processes, high density plasma chemical vapor deposition (HDPCVD) processes, plasma immersion ion implantation (P3I) processes, and plasma etch processes, have become essential in semiconductor processing. Plasma provides many advantages in manufacturing semiconductor devices. For example, using plasma enables a wide range of applications due to lowered processing temperature, plasma enhanced deposition has excellent gap-fill for high aspect ratio gaps and high deposition rates.

One problem that occurs during plasma processing is deformation of a substrate being processed, especially for a device substrate, i.e. a patterned substrate at high temperatures. Semiconductor devices are formed by stacking layers of materials in a certain pattern on a semiconductor substrate. During processing, a patterned substrate may "bow" due to differences in thermal expansion among layers of different materials, particularly when the substrate is being heated. Bowing of the substrate may lead to non-uniformity of the process surface. The sides and back of a bowed substrate may be processed which not only wastes processing material, as precursors for plasma processing are usually very expensive, but also leads to contamination and other issues for subsequent processes.

Therefore, there is a need for apparatus and methods for processing a substrate while reducing backside deposition on the substrate.

SUMMARY

Implementations of the present disclosure generally relate to the fabrication of integrated circuits. More particularly, the implementations described herein provide techniques for deposition of thick hardmask films on a substrate. In one implementation, a method of forming a hardmask layer on a substrate is provided. The method comprises applying a chucking voltage to a substrate positioned on an electrostatic chuck in a processing chamber, forming a seed layer comprising boron on a film stack disposed on a substrate by supplying a seed layer gas mixture in the processing chamber while maintaining the chucking voltage, forming a transition layer comprising boron and tungsten on the seed layer by supplying a transition layer gas mixture in the processing chamber and forming a bulk hardmask layer on the transition layer by supplying a main deposition gas mixture in the processing chamber.

In another implementation, a method of forming a hardmask layer on a substrate is provided. The method comprises applying a chucking voltage to a substrate positioned on an electrostatic chuck in a processing chamber. The method further comprises forming a seed layer comprising boron on a film stack disposed on the substrate. Forming the seed layer comprising boron comprises supplying a seed layer gas mixture in the processing chamber while maintaining the chucking voltage. The seed layer gas mixture comprises at least a boron-based precursor gas and a nitrogen-based precursor gas. Forming the seed layer comprising boron further comprises steadily supplying the nitrogen-based precursor gas and varying the flow of the boron-based precursor gas in the processing chamber to form the seed layer. The method further comprising forming a transition layer comprising boron and tungsten on the seed layer by supplying a transition layer gas mixture in the processing chamber. The method further comprises forming a bulk hardmask layer on the transition layer by supplying a main deposition gas mixture in the processing chamber.

In yet another implementation, a method of forming a hardmask layer on a substrate is provided. The method comprises applying a chucking voltage to a substrate positioned on an electrostatic chuck in a processing chamber. The method further comprises forming a boron nitride layer on a film stack disposed on the substrate by supplying a seed layer gas mixture in the processing chamber while maintaining the chucking voltage. The method further comprises forming a boron tungsten nitride layer on the boron nitride layer by supplying a transition layer gas mixture in the processing chamber. The method further comprises forming a tungsten nitride layer on the boron nitride layer by supplying a main deposition gas mixture in the processing chamber.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
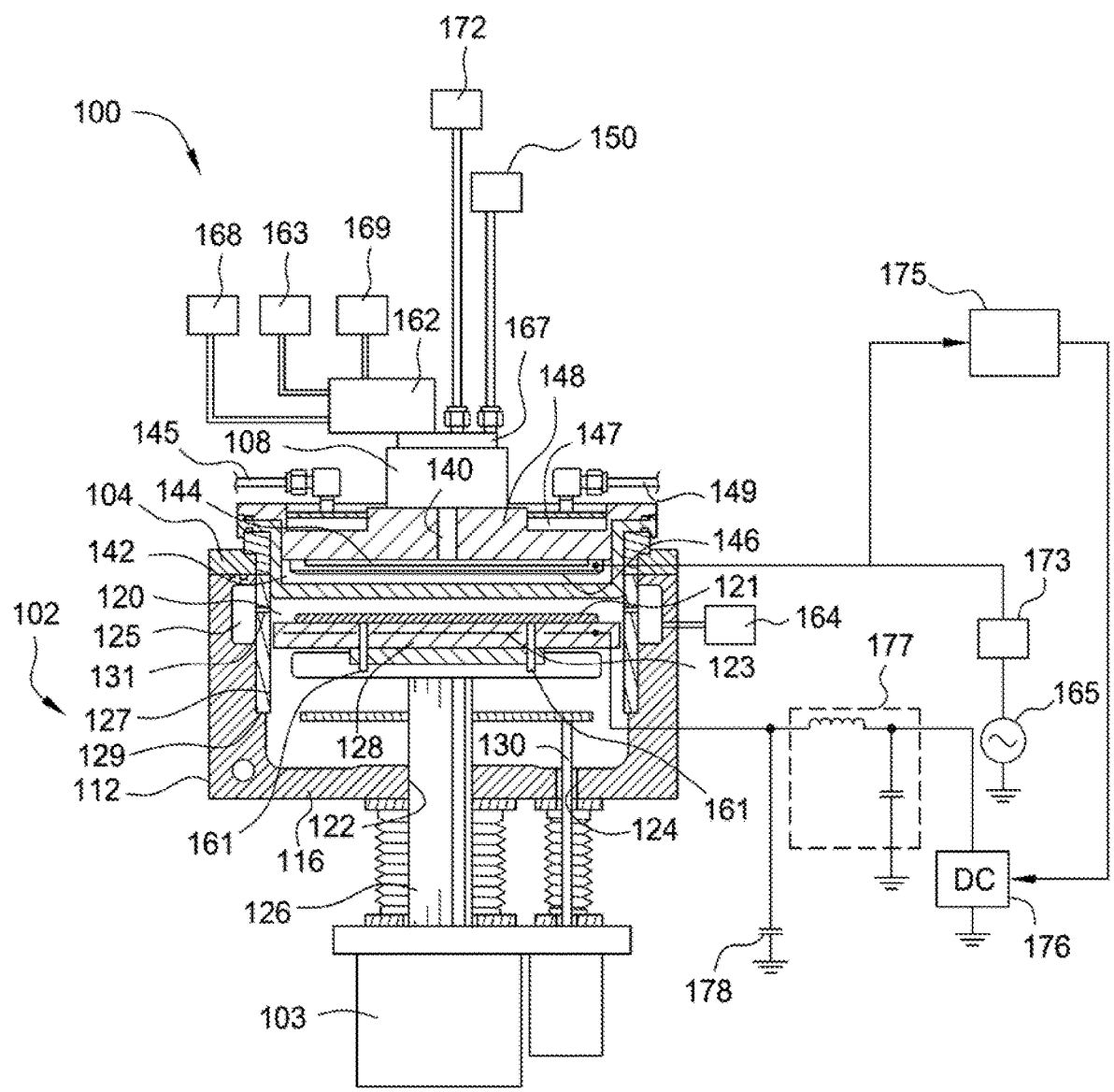
FIG. 1 depicts a schematic cross-sectional view of a PECVD system that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques for deposition of thick hardmask films on a substrate. Certain details are set forth in the following description and in FIGS. 1-6 to provide a thorough understanding of various implementations of the disclosure. Other details describing well-known structures and systems often associated with plasma processing and hardmask deposition are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems and PRODUCER® SE™ systems which are commercially available from Applied Materials, Inc., of Santa Clara, Calif. Other tools capable of performing PECVD processes may also be adapted to benefit from the implementations described herein. In addition, any system enabling the PECVD processes described herein can be used to advantage. The apparatus description described herein is illustrative and should not be construed or interpreted as limiting the scope of the implementations described herein.

Implementations of the present disclosure generally relate to the fabrication of integrated circuits. More particularly, the implementations described herein provide techniques for deposition of thick hardmask films on a substrate. The implementations described herein enable deposition of thick tungsten hardmask films (e.g., 100 nanometers or greater) on high compressive or tensile bow substrates using electrostatic chucking method and alternating PECVD methods. The thick tungsten hardmask films described herein may be doped, for example, with boron, carbon, nitrogen and/or silicon. The thick tungsten hardmask films described herein may be deposited on a variety of substrates or layers, for example, SiO2, SiN, a-Si, oxide-nitride stacks, TiN, Si, and poly-Si, with good adhesion and amorphous microstructure. In some implementations, the application of electrostatic chucking eliminates use of a shadow ring during RF-based deposition and prevents backside deposition, while ensuring sufficient adhesion at edge and bevel. In some implementations, the application of electrostatic chucking eliminates use of a shadow ring for thick tungsten deposition at high temperatures (e.g., 300 degrees Celsius or greater). In some implementations, alternating PECVD is implemented to limit seed thickness, for example, below 100 angstroms, to enhance material uniformity, while reducing technical difficulty during subsequent etch processes.

To achieve higher capacity and lower unit cost for memory applications, integrated circuit ("IC") manufacturers are seeking vertical expansion to overcome horizontal dimension limits. Currently, the deposition of tungsten films is limited to thin layers during IC fabrication and thus is limited to fill applications. There are several issues limiting application of tungsten films to applications such as hardmasks. First, tungsten films typically diffuse to the backside of substrates when deposited at high-thickness conditions. Further, tungsten films typically fail to adhere to $SiO_2$, a-Si or poly-Si substrates. In addition, deposition of tungsten films on bow-substrates often leads to backside and bevel/edge contamination.

As the number of stacks increase in next-generation devices, higher aspect ratio structures are needed, where a non-collapsing highly etch selective hardmask is used to transfer the pattern from photolithography. Amorphous tungsten hardmask films demonstrate greater than two times higher etch selectivity and mechanical stability when compared to conventional amorphous carbon based films.

However, as the number of stacks in device fabrication increases, incoming substrate bow during tungsten hardmask deposition is very compressive or tensile. On these bow substrates, tungsten hardmask deposition often results in backside contamination, since tungsten precursors can quickly diffuse to the backside and tungsten thermal deposition is not constrained by the plasma region.

The inventors have identified the mechanism for peeling/adhesion at different interfaces. Not to be bound by theory but it is believed that the peeling is driven by competition between fluorine diffusion and trapping. Fluorine saturation at any interface between films typically leads to peeling. The inventors have discovered that RF based processes can deposit layers with more traps for fluorine, which improves adhesion. Therefore, RF based seeding is desirable, and shadow ring processes are no longer essential to guarantee bevel/edge adhesion and prevent backside deposition. The electrostatic chucking (ESC) based processes described herein allow RF based seed layer deposition without use of a shadow ring, and thus provide a promising method for thick tungsten film deposition on silicon oxide/nitride substrates for hardmask applications.

Shadow rings have been used to prevent bulk deposition, which is typically RF-based, from depositing on the bevel edge and backside of the substrate. One disadvantage with the shadow ring approach is that masking a portion of the substrate perimeter with the shadow ring prevents deposition of the RF-based seed layer on the bevel edge prior to deposition of the bulk layer. However, during deposition of the bulk tungsten film, tungsten deposits at the bevel edge and the backside of the substrate. Tungsten can easily diffuse and deposit thermally. Due to the lack of a seed layer on the bevel edge, tungsten deposited on the bevel edge and backside of the substrate peels off easily. Failure to deposit a seed layer on the bevel edge results in poor adhesion of the subsequently deposited bulk tungsten film.

Non-metal PECVD seed was first developed to provide good adhesion to silicon, oxide and nitride surfaces. Non-tungsten based seed layers and transition layers of the hardmask film cause distortion in etch profiles since etch rate varies with different chemical composition. Without the seed and transition layers, however, the bulk morphology becomes rough and columnar and the film has poor adhesion to silicon, oxide and nitride substrates. Besides, thick layers of seed and transition are requisite to maintain good film morphology and adhesion, which makes the etch profile distortion worse.

Atomic layer deposition (ALD) based seed layers (e.g., TiN, W, WSiN films) have shown good adhesion to silicon, oxide and nitride, but are not sufficient to glue the PECVD thick tungsten films to substrates, possibly due to the lack of defects for F trapping.

Therefore, the implementations described herein include tungsten-based PECVD seed technology. Compared to ALD films, the RF and gas flows of the implementations described herein introduce more fluorine traps per unit thickness, which allow for use of thin seed layers.

In the implementations described herein, substrates having a bow of, for example, +/−400 micrometers, can be processed. The actual bow during the process may be higher, due to the thermal expansion mismatch at the high temperature in the chamber.

In one implementation, an electrostatic chucking method (e.g., voltage from 10 to 3000 volts) is used to clamp the substrate for tungsten-based film deposition. The electrostatic chucking flattens the substrate closely against the substrate support, preventing backside deposition without the use of a shadow ring. In the absence of the shadow ring, the seed layer is deposited via PECVD on the edge and bevel area, where film adhesion is significantly improved.

It has been found by the inventors that the alternating PECVD seed process described herein reduces the grain size and roughness of the film improving film adhesion. Alternating gas flow during deposition disrupts crystallization, which creates defects that trap fluorine and enables isotropic growth. The gas flow of one or more gases (e.g., $H_2$, He, $B_2H_6$, hydrocarbons, $N_2$, $N_2O$, $NO_2$, $N_2O_4$, $NH_3$, $NF_3$, $SiH_4$, $Si_2H_6$, $CH_4$, $C_2H_2$, $C_3H_6$, $C_4H_6$, $C_5H_{10}$, $O_2$, $O_3$, $H_2O$, Ar, $WF_6$, $WCl_6$, $W(CO)_6$, and organometallic compounds of tungsten) can be alternated. The alternating time intervals for gas ON and gas OFF can be the same or different, ranging, for example, from 0.1 to 100 seconds—or gradually increasing. RF/flow can be controlled by system pulsing software. Morphology and adhesion of the deposited films are improved due to smaller grain size and better chemical bonding at interfaces and within the deposited films.

FIG. 1 depicts a schematic illustration of a PECVD system 100 having an electrostatic chuck 128 that can be used for the practice of implementations described herein. It should be noted that although a PECVD system is described in this application, apparatus and method of the present disclosure may apply to any suitable plasma process using an electrostatic chuck. The PECVD system 100 generally comprises a chamber body 102 supporting a chamber lid 104, which may be attached to the chamber body 102 by a hinge. The chamber body 102 comprises sidewalls 112 and a bottom wall 116 defining a processing region 120. The chamber lid 104 may comprise one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of an electrostatic chuck passes through the passage 122. A rod 130 configured to activate substrate lift pins 161 passes through the passage 124.

A chamber liner 127 made of ceramic or the like is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the pumping channel 125.

The gas distribution system 108 is configured to deliver reactant and cleaning gases and is disposed through the chamber lid 104 to deliver gases into the processing region 120. The gas distribution system 108 includes a gas inlet passage 140, which delivers gas into a showerhead assembly 142. The showerhead assembly 142 is comprised of an annular base plate 148 having a blocker plate 144 disposed intermediate to a faceplate 146.

A cooling channel 147 is formed in the annular base plate 148 of the gas distribution system 108 to cool the annular base plate 148 during operation. A cooling inlet 145 delivers a coolant fluid, such as water or the like, into the cooling channel 147. The coolant fluid exits the cooling channel 147 through a coolant outlet 149.

The chamber lid 104 has matching passages to deliver gases from one or more gas inlets 163, 168, 169 through a remote plasma source 162 to a gas inlet manifold 167 positioned on top of the chamber lid 104. The PECVD system 100 may comprise one or more liquid delivery sources 150 and one or more gas sources 172 configured to provide a carrier gas and/or a precursor gas.

The electrostatic chuck 128 is configured for supporting and holding a substrate being processed. In one implementation, the electrostatic chuck 128 may comprise at least one electrode 123 to which a voltage is applied to electrostatically secure a substrate thereon. The electrode 123 is powered by a direct current (DC) power supply 176 connected to the electrode 123 via a low pass filter 177. The electrostatic chuck 128 may be monopolar, bipolar, tripolar, DC, interdigitated, zonal, and the like.

In one implementation, the electrostatic chuck 128 is movably disposed in the processing region 120 driven by a drive system 103 coupled to the stem 126. The electrostatic chuck 128 may comprise heating elements, for example resistive elements, to heat a substrate positioned thereon to a desired process temperature. Alternatively, the electrostatic chuck 128 may be heated by an outside heating element such as a lamp assembly. The drive system 103 may include linear actuators, or a motor and reduction gearing assembly, to lower or raise the electrostatic chuck 128 within the processing region 120.

An RF source 165 is coupled to the showerhead assembly 142 through an impedance matching circuit 173. The faceplate 146 of the showerhead assembly 142 and the electrode 123, which may be grounded via a high pass filter, such as a capacitor 178, form a capacitive plasma generator. The RF source 165 provides RF energy to the showerhead assembly 142 to facilitate generation of a capacitive plasma between the faceplate 146 of the showerhead assembly 142 and the electrostatic chuck 128. Thus, the electrode 123 provides both a ground path for the RF source 165 and an electric bias from the DC power supply 176 to enable electrostatic clamping of the substrate.

The RF source 165 may comprise a high frequency radio frequency (HFRF) power source, e.g., a 13.56 MHz RF generator, and/or a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

As shown in FIG. 1, the PECVD system 100 may further include a system controller 175. The system controller 175 may be configured to calculate and adjust the flatness of the substrate 121 being processed in the PECVD system 100. In one implementation, the system controller 175 may calculate flatness or chucking status of the substrate 121 by monitoring characteristics, such as imaginary impedance, of the electrostatic chuck 128. When measurement of the imaginary impedance indicates that the substrate 121 decreases in flatness, the system controller 175 may increase chucking power by adjusting the DC power supply 176. In one implementation, decreased flatness of the substrate 121 may be indicated by negatively increased imaginary impedance of the electrostatic chuck 128.

Figure 2:
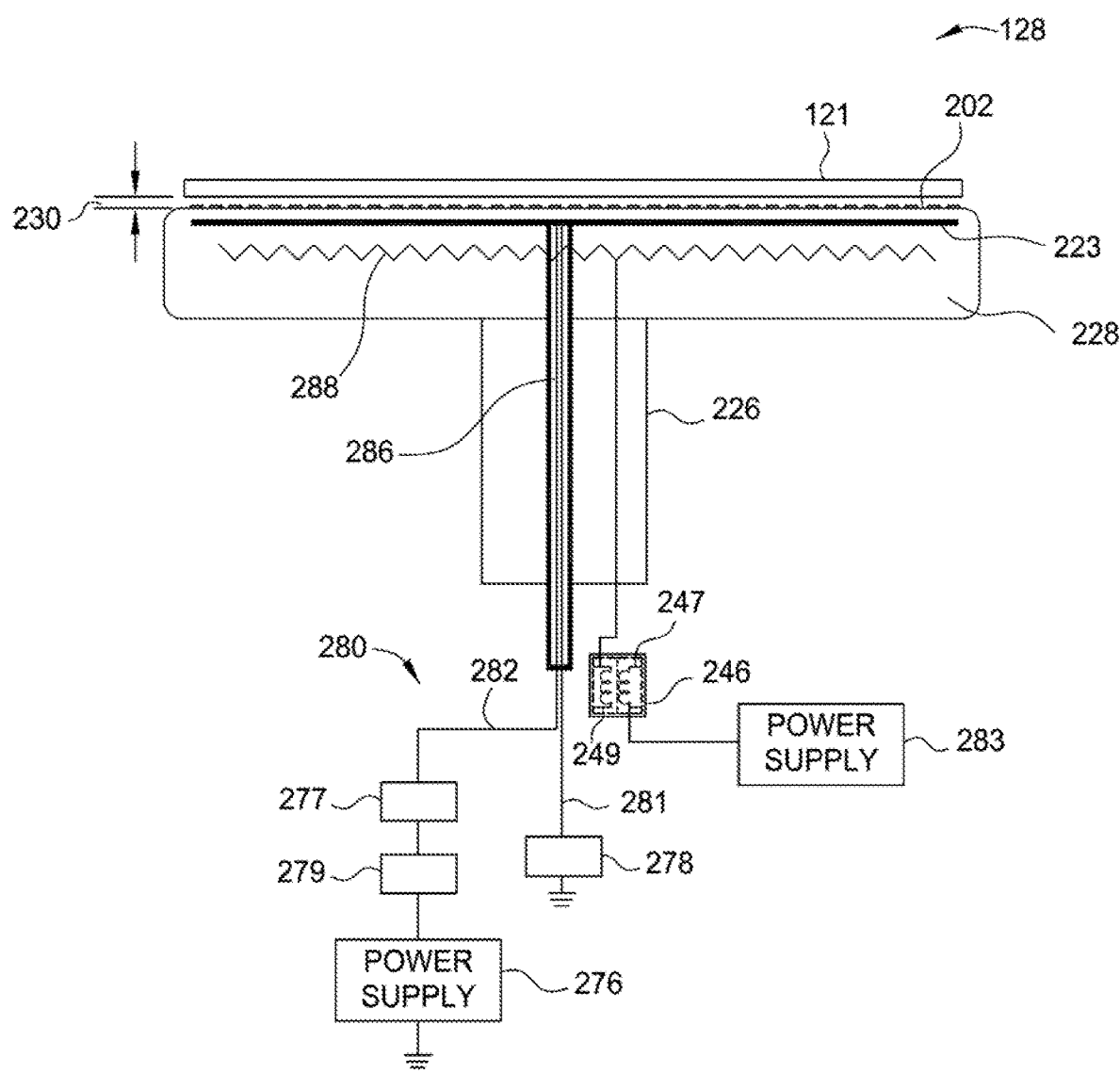
FIG. 2 depicts a schematic cross-sectional view of an electrostatic chuck of the apparatus of FIG. 1 that can be used for the practice of implementations described herein.

FIG. 2 depicts a schematic cross-sectional view of an electrostatic chuck 128 of the apparatus of FIG. 1 that can be used for the practice of implementations described herein. The electrostatic chuck 128 comprises a chuck body 228 coupled to a support stem 226. The chuck body 228 has a top surface 202 configured to provide support and clamp the substrate 121 during processing. The chuck body 228 of the electrostatic chuck 128 comprises an electrode 223 coupled to a conductive member 286. The electrode 223 may be a metal electrode of comparable size to the substrate inside the chuck body 228, and may be built to be substantially parallel to the substrate 121, which will be held against the top surface 202 of the chuck body 228. The electrode 223 may be arranged in any configuration or pattern such that the electrodes are evenly distributed across the top surface 202. For example, the electrode 223 may be arranged in a grid-like, a pixel-like or dot-like configuration. The conductive member 286 may be a rod, a tube, wires, or the like, and be made of a conductive material, such as molybdenum (Mo), tungsten (W), or other material with a substantially similar coefficient of expansion with other materials comprising the chuck body 228.

In one implementation, the electrostatic chuck uses a single piece of the electrode 223 to maintain substantially uniform voltage between the electrode 223 and the substrate 121. Alternatively, the electrostatic chuck may use bipolar ESC where multiple chucking electrodes with different voltages are used to generate the clamping force. In some implementations, the electrostatic chuck 128 may have a biasing electrode embedded or disposed in the chuck body 228 to provide an electrical bias to the substrate to promote or enhance the electrostatic clamping of the substrate. Alternatively, the electrode 223 may provide both a ground path for a radio frequency (RF) power (e.g., the RF source 165 in FIG. 1) and an electric bias to the substrate 121 to enable electrostatic clamping of a substrate.

In order to provide an electrical bias to the substrate 121, the electrode 223 may be in electronic communication with a power supply system 280 that supplies a biasing voltage to the electrode 223. The power supply system 280 includes a power supply 276 that may be a direct current (DC) power source to supply a DC signal to the electrode 223. In one implementation, the power supply 276 is a 24-volt DC power supply and the electrical signal may provide a positive or negative bias. The power supply 276 may be coupled to an amplifier 279 to amplify the electrical signal from the power supply 276. The amplified electrical signal travels to the conductive member 286 by a connector 282, and may travel through a network of electrical circuitry 277 to filter the amplified signal to remove noise and/or remove any RF current from the biasing voltage from the power supply system 280. The amplified and filtered electrical signal is provided to the electrode 223 and the substrate 121 to enable electrostatic clamping of the substrate 121. The electrode 223 may also function as an RF ground, wherein RF power is coupled to ground by a connector 281. A capacitor 278 may be coupled to the ground path to prevent the biasing voltage from going to ground. In this manner, the electrode 223 functions as a substrate-biasing electrode and an RF return electrode.

In some implementations, the substrate 121 may be in partial contact with the top surface 202 of the chuck body 228, forming a contact gap 230, which is capacitor in nature. The chucking voltage is applied to the contact gap 230, which effectively generates the needed chucking force. In operation, the power supply 276 serves as a source of electric charge, and from the electrode 223 the stored charge can migrate to the top surface 202 of the chuck body 228 through the bulk material (of the chuck body 228) of finite electrical conductivity. The surface charge then induces an equal amount, but of the opposite polarity charge on the bottom of the substrate 121 where the Columbic attraction forces between the opposite charges will effectively hold the substrate 121 against the top surface 202. Some of the induced surface charges on the bottom of the substrate 121 may be come from a contact connection between the top surface 202 of the substrate 121 and the other end of the power supply 276, through a common ground connection that is the conductive chamber wall. Such a connection may be formed by striking and sustaining plasma between the substrate 121 and the chamber sidewalls (e.g., sidewalls 112 shown in FIG. 1) which behave as a conductive media to close the electric current loop to supply the chucking voltage and charges to the contact gap 230. Releasing the substrate from the electrostatic chuck is achieved by removing the chucking voltage supplied to the electrode 223, together with the charges contained in the chuck body 228, and in the meantime the plasma is kept running until the charges on the substrate 121 is drained.

In various implementations of this disclosure, the chuck body 228 comprises, or is composed of a ceramic material capable of providing sufficient chucking force to the substrate in a temperature range of about −20 degrees Celsius to about 850 degrees Celsius (e.g., from about 350 degrees Celsius to about 700 degrees Celsius; from about 350 degrees Celsius to about 500 degrees Celsius; or from about 400 degrees Celsius to about 480 degrees Celsius). Suitable ceramic materials may include, but are not limited to aluminum nitride (AlN), aluminum oxide ($Al_2O_3$), silicon dioxide ($SiO_2$), or other ceramic materials.

Referring back to FIG. 2, in some implementations the chuck body 228 may include one or more heaters 288 to provide heat to the chuck body 228. The one or more heater(s) 288 may be embedded in the chuck body 228. The heat from the heater 288 is then transferred to the substrate 121 to enhance a fabrication process, such as a deposition process. The heater 288 may or may not be positioned in parallel to the electrode 223. Although the heater 288 is shown in a position below the electrode 223, the electrode may be disposed along the same plane as, or above the heater 288. The heater 288 may be a single continuous metal line or may be in the form of discrete metal lines. The heater 288 may be any heating device that is suitable for providing inductive or resistive heating to the electrostatic chuck. A temperature sensor (not shown), such as a thermocouple, may be embedded in the chuck body 228. The temperature sensor may be connected to a temperature controller (not shown) which provides control signal to a power supply 283 to control the temperature of the chuck body 228.

The heater 288 is coupled to the power supply 283 through the support stem 226 to supply power to the heater 288. The power supply 283 may include a direct current (DC) power source, an alternating current (AC) power source, or a combination of both. In one implementation, the power supply 283 is an alternating current (AC) power source to provide AC signal to the heater 288. The heater 288 may be composed of a resistive metal, a resistive metal alloy, or a combination of the two. Suitable materials for the heating elements may include those with high thermal resistance, such as tungsten (W), molybdenum (Mo), titanium (Ti), or the like. The heater 288 may also be fabricated with a material having thermal properties, e.g., coefficient of thermal expansion, substantially similar to that of the material comprising the chuck body 228 to reduce stress caused by mismatched thermal expansion.

The heater 288 may be arranged in any predetermined pattern to control the operating temperature as well as its uniformity across the top surface 202 of the chuck body 228 and the substrate 121. For example, the heater 288 may be arranged to provide a single heating zone or multiple independently, azimuthally controllable heating zones across the top surface 202 of the chuck body 228. The position and layout of the heater 288 directly affect the operating temperature and the temperature distribution, or the temperature profile across the chuck surface. Such temperature profile may be substantially consistent over a period, or may be changed to a different yet effective one by dynamically adjusting the power to each of the heater elements. Closed loop temperature control based on in-situ temperature sensors embedded inside the chuck body 228 may be used to maintain accurate operating temperature and the temperature gradient across the chuck body 228 and the substrate surface. It is contemplated that different heater zone configuration such as one, two, three, four or more zone heaters combined with the chucking function is possible depending upon the process requirement. The position and layout of the chuck body 228 as well as the operating temperature during the film deposition can be manipulated by an ordinary skill in the art to control thickness, uniformity, stress, dielectric constant, or refractive indexes, etc. of a film.

In some implementations, the network of electrical circuitry 277 may be configured to protect the power supplies for the ESC and for the heater 288 against AC and reactive RF voltage and current, which may couple to the chucking electrode and the heater 288 through the ESC dielectric materials. Such coupling could be detrimental to the DC power supplies or AC power sources, which are not designed to handle the respective AC and RF load. To protect the ESC power supply and the AC power lines for heaters, the network of electrical circuitry may include RF filters circuitry with high input impedance to minimize or prevent the RF voltage and current from going into the load it protects. The RF filters circuit may depend on the operating frequency. For example, at 13.56 MHz, a simple LC parallel resonant circuit presents to the high voltage side as a high impedance circuit and thus may act as an open circuit for the RF frequency but act as pass through for other frequencies and for DC. In case where multiple RF frequencies are involved, multiple filter stages can be used to satisfy a minimum RF impedance requirement at each of the operating frequency.

One approach of reducing the ESC chucking leakage current going to ground through the heater 288 is to float the heater 288 with respect to ground potential. This method is believed to eliminate the portion of the ground current completely regardless of the resistivity of the bulk dielectric materials for the chuck body 228. An example of implementing such DC isolation is to power the heater 288 by AC lines of 50 Hz or 60 Hz, through an isolation transformer 246 disposed between the heaters 288 and the power supply 283. The isolation transformer 246 is used to cut off ground current path. In such a case, the isolation transformer 246 may include primary coil windings 247 and secondary coil windings 249. The primary coil windings 247 may be connected to the power supply 283 while the secondary coil windings 249 may be connected to the electrical load sought to be protected (i.e., the heater 288). Therefore, the heater 288 can be electrically isolated from the AC voltage source and any transients from the external source to reduce the leakage current. In most cases, the isolation transformer 246 should be designed to stand for the maximum ESC voltage without breaking down, while allowing no DC current across its primary and secondary coil windings. In the meantime, however, the AC current may pass freely between the primary and the secondary coil windings of the isolation transformer 246. Depending upon the configuration of the heater 288, the isolation transformer 246 could be a single-zone or multi-zone isolated transformer. In cases where the electrostatic chuck including multiple heating zones, multiple transformers or a single transformer with multiple primary and, or secondary coil windings may be used to maintain DC isolation between the heaters to ground.

Figure 3:
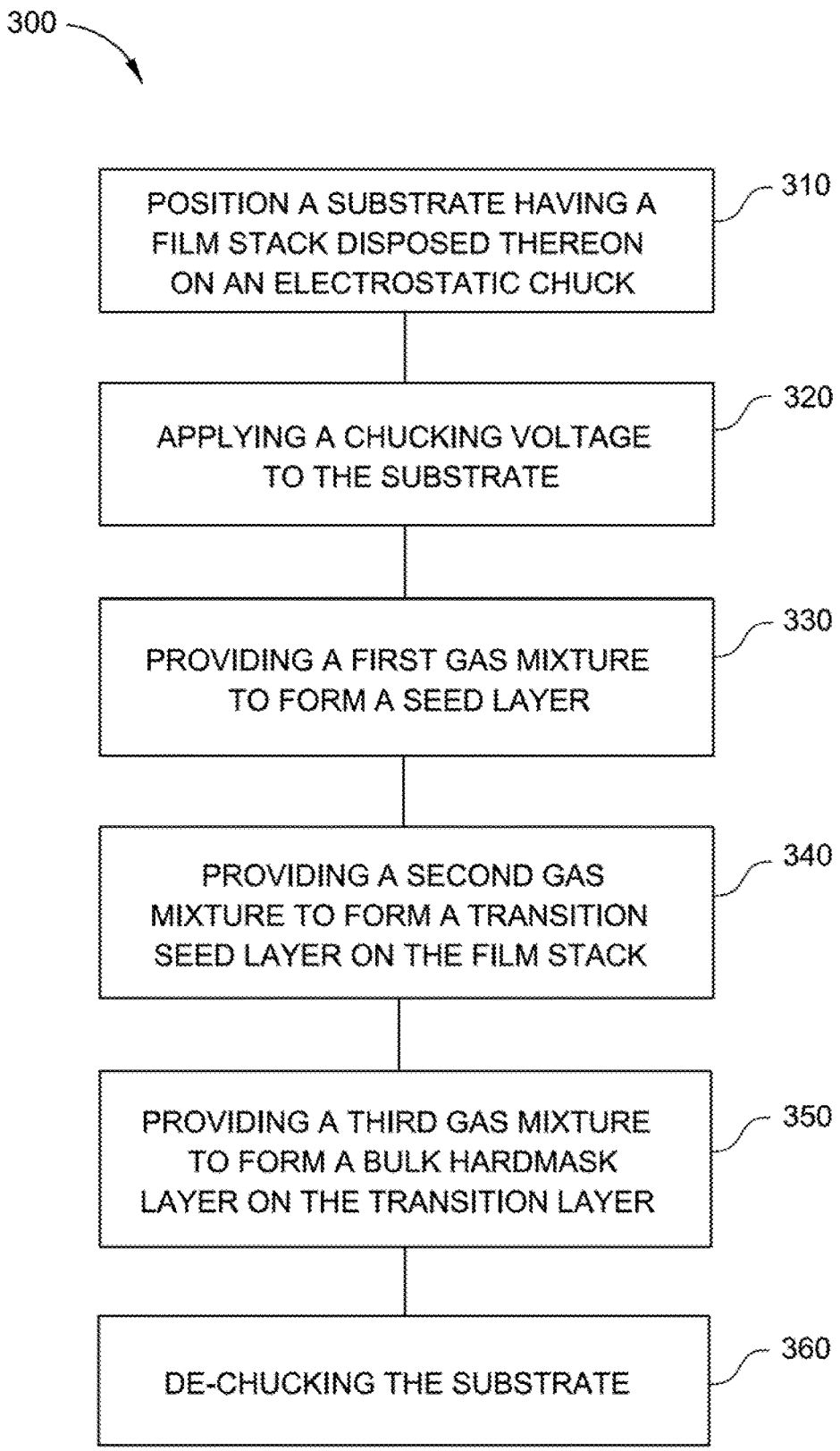
FIG. 3 depicts a flow diagram of a method for forming a tungsten hardmask layer on a film stack disposed on a substrate in accordance with one implementation of the present disclosure.

FIG. 3 depicts a flow diagram of a method 300 for forming a tungsten hardmask layer on a film stack disposed on a substrate in accordance with one implementation of the present disclosure. The hardmask layer formed on a film stack may be utilized, for example, to form stair-like structures in the film stack. FIGS. 4A-4D are schematic cross-sectional views illustrating a sequence for forming a hardmask layer on a film stack disposed on a substrate according to the method 300. Although the method 300 is described below with reference to a hardmask layer that may be formed on a film stack utilized to manufacture stair-like structures in the film stack for three dimensional semiconductor devices, the method 300 may also be used to advantage in other device manufacturing applications. The time intervals for the operations described in method 300 ($T_1$, $T_2$, $T_3$, etc.) can be of the same length ($T_1=T_2=T_3=T_4= \ldots$), different lengths for gas-on and gas-off ($T_1=T_3=T_5= \ldots =T_{(odd)}$, $T_2=T_4=T_6= \ldots =T_{(even)}$, and $T_{(odd)}>$ or $<T_{(even)}$), or other different lengths, including gradual increase/decrease and random. In some implementations, the time interval ranges from 0.1 seconds to 100 seconds.

Figure 4A:
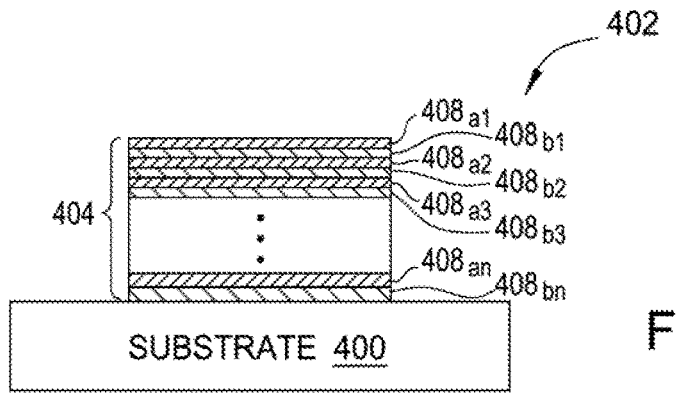
FIGS. 4A-4D depict one implementation of a sequence for forming a tungsten hardmask layer on a film stack formed on a substrate in accordance with the implementation shown in FIG. 3.

The method 300 begins at operation 310 by positioning a substrate, such as a substrate 400 depicted in FIG. 4A, into a processing chamber, such as the processing chamber of the PECVD system 100 depicted in FIG. 1. The substrate 400 may be positioned on an electrostatic chuck, for example, the top surface 202 of electrostatic chuck 128. The substrate 400 may be a silicon-based material or any suitable insulating material or conductive material as needed, having a film stack 404 disposed on the substrate 400 that may be utilized to form a structure 402, such as stair-like structures, in the film stack 404.

As shown in the exemplary implementation depicted in FIG. 4A, the substrate 400 may have a substantially planar surface, an uneven surface, or a substantially planar surface having a structure formed thereon. The film stack 404 is formed on the substrate 400. In one implementation, the film stack 404 may be utilized to form a gate structure, a contact structure or an interconnection structure in a front end or back end process. The method 300 may be performed on the film stack 404 to form the stair-like structures therein used in a memory structure, such as NAND structure. In one implementation, the substrate 400 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 400 may have various dimensions, such as 200 mm, 300 mm, and 450 mm or other diameter substrates, as well as, rectangular or square panels. Unless otherwise noted, implementations and examples described herein are conducted on substrates with a 200 mm diameter, a 300 mm diameter, or a 450 mm diameter substrate. In the implementation wherein a SOI structure is utilized for the substrate 400, the substrate 400 may include a buried dielectric layer disposed on a silicon crystalline substrate. In the implementation depicted herein, the substrate 400 may be a crystalline silicon substrate.

In one implementation, the film stack 404 disposed on the substrate 400 may have a number of vertically stacked layers. The film stack 404 may comprise pairs including a first layer (shown as $408a_1$, $408a_2$, $408a_3$, ..., $408a_n$) and a second layer (shown as $408b_1$, $408b_2$, $408b_3$, ..., $408b_n$) repeatedly formed in the film stack 404. The pairs includes alternating first layer (shown as $408a_1$, $408a_2$, $408a_3$, ..., $408a_n$) and second layer (shown as $408b_1$, $408b_2$, $408b_3$, ..., $408b_n$) repeatedly formed until desired numbers of pairs of the first layers and the second layers are reached.

Figure 4B:
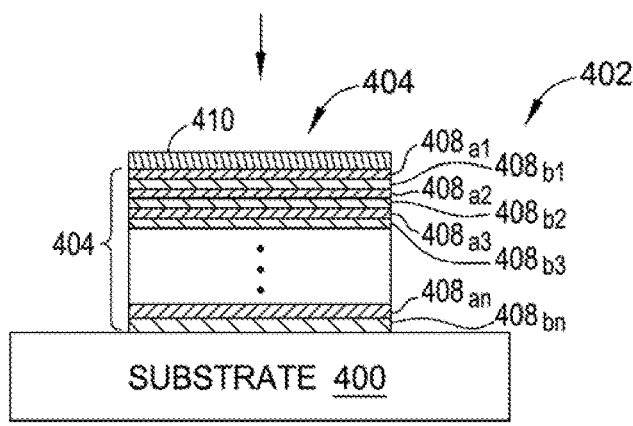
Figure 4C:
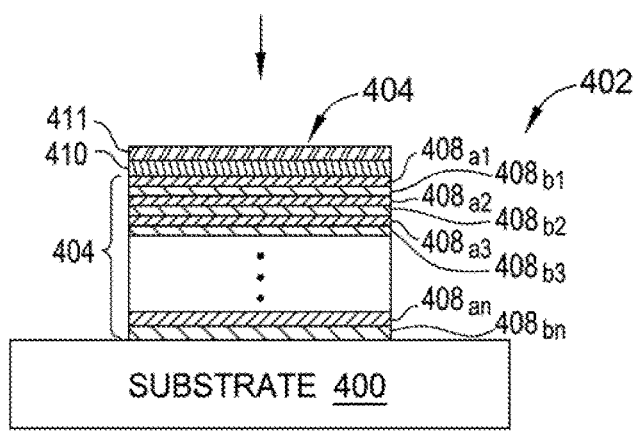

The film stack 404 may be a part of a semiconductor chip, such as a three-dimensional memory chip. Although three repeating layers of first layers (shown as $408a_1$, $408a_2$, $408a_3$, ..., $408a_n$) and second layers (shown as $408b_1$, $408b_2$, $408b_3$, ..., $408b_n$) are shown in FIGS. 4A-4C, it is noted that any desired number of repeating pairs of the first and the second layers may be utilized as needed.

In one implementation, the film stack 404 may be utilized to form multiple gate structures for a three-dimensional memory chip. The first layers $408a_1$, $408a_2$, $408a_3$, ..., $408a_n$ formed in the film stack 404 may be a first dielectric layer and the second layers $408b_1$, $408b_2$, $408b_3$, ..., $408b_n$ may be a second dielectric layer. Suitable dielectric layers may be utilized to form the first layers $408a_1$, $408a_2$, $408a_3$, ..., $408a_n$ and the second layer $408b_1$, $408b_2$, $408b_3$, ..., $408b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some implementations, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $408a_1$, $408a_2$, $408a_3$, ..., $408a_n$ are silicon oxide layers and the second layers $408b_1$, $408b_2$, $408b_3$, ..., $408b_n$ are silicon nitride layers or polysilicon layers disposed on the first layers $408a_1$, $408a_2$, $408a_3$, ..., $408a_n$. In one implementation, the thickness of first layers $408a_1$, $408a_2$, $408a_3$, ..., $408a_n$ may be controlled at between about 50 Å and about 1000 Å, such as about 500 Å, and the thickness of the each second layers $408b_1$, $408b_2$, $408b_3$, ..., $408b_n$ may be controlled at between about 50 Å and about 1000 Å, such as about 500 Å.

The film stack 404 may have a total thickness between about 100 Å and about 2000 Å. In one implementation, total thickness of the film stack 404 is about 3 microns to about 10 microns and will vary as technology advances.

It is noted that the hardmask layer may be formed on any surfaces or any portion of the substrate 400 with or without the film stack 404 present on the substrate 400.

At operation 320, a chucking voltage is applied to the electrostatic chuck to clamp the substrate 400 to the electrostatic chuck. In implementations, where the substrate 400 is positioned on the top surface 202 of the electrostatic chuck 128, the top surface 202 provides support and clamps the substrate 400 during processing. The electrostatic chucking flattens the substrate 400 closely against the top surface 202, preventing backside deposition without the use of a shadow ring. An electrical bias is provided to the substrate 400 via electrode 223, the electrode 223 may be in electronic communication with power supply system 280 that supplies a biasing voltage to the electrode 223. In one implementation, the chucking voltage is between about 10 volts and about 3000 volts. In one implementation, the chucking voltage is between about 100 volts and about 2000 volts. In one implementation, the chucking voltage is between about 200 volts and about 1000 volts.

During operation 320, several process parameters may be regulated during the process. In one implementation suitable for processing a 300 mm substrate, the process pressure may be maintained at about 0.1 Torr to about 80 Torr (e.g., about 1 Torr to about 10 Torr; or about 1 Torr to about 4 Torr). Operation 320 may be performed with plasma, without plasma, or partially with plasma. A RF source power between about 100 Watts and about 1000 Watts may be supplied to the processing region during operation 320. A RF bias power between about 0 Watts and about 500 Watts may be optionally supplied during operation 320.

In one implementation, a constant chucking voltage is applied to the substrate 400. In one implementation, the chucking voltage may be pulsed to the electrostatic chuck. In some implementations, a backside gas may be applied to the substrate 400 while applying the chucking voltage to control the temperature of the substrate. Backside gases may include but are not limited to, helium (He), argon (Ar), or the like.

At operation 330, after the substrate 400 is transferred to the processing region, such as the processing region 120 of PECVD system 100 depicted in FIG. 1, a seed layer gas mixture is supplied into the processing region 120 to deposit a seed layer 410 on the film stack 404, as shown in FIG. 4B. In one implementation, the chucking voltage supplied in operation 320 is maintained during operation 330. The seed layer 410 may be any suitable seed layer. Examples of suitable seed layers include, but are not limited to, boron carbide (BC), boron nitride (BN), boron carbon nitride (BCN), carbon nitride (CN), silicon carbide (SiC), silicon nitride (SiN), boron-based seed layers, carbon-based seed layers, and tungsten silicide (WSi). In one implementation, the seed layer 410 is formed by one of the processes depicted in FIGS. 5A-5C.

During deposition of the seed layer 410, the process parameters utilized to ignite and form the plasma in the gas mixture may be dynamically controlled or preset to a predetermined flow rate to facilitate depositing the seed layer 410 with desired film properties and film microstructure. The seed layer gas mixture includes reactive precursor gases for depositing the aforementioned seed layers. Exemplary reactive precursor gases for depositing the seed layer include boron-based precursor gases, carbon-based precursor gases, nitrogen-based precursor gases, silicon-based precursor gases, and tungsten-based precursor gases. Suitable boron-based precursor gases for forming the seed layer include, but are not limited to, trimethylboron ($(B(CH_3)_3)$ or TMB), diborane ($B_2H_6$), boron trifluoride ($BF_3$), and triethylboron ($(B(C_2H_5)_3)$ or TEB) and combinations thereof. Suitable carbon-based precursor gases for forming the seed layer include, but are not limited to, $CH_4$, $C_2H_2$, $C_3H_6$, $C_4H_8$, $C_5H_{10}$, and the like. Suitable nitrogen-based precursor gases for forming the seed layer include, but are not limited to, nitrogen gas ($N_2$), $NH_3$, $N_2O$, $NO_2$, $NO$, $N_2O_4$, and the like. Suitable silicon-containing precursor gases for forming the seed layer include silane-containing precursor gases, including, but not limited to silane ($SiH_4$), di-silane ($Si_2H_6$), higher order silanes, and the like. Suitable tungsten-containing precursor gases for forming the seed layer include, but are not limited to, $WF_6$, $WCl_6$, $W(CO)_6$, and the like. Suitable hydrogen-based precursor gases include, but are not limited to, $H_2$, $H_2O$, $H_2O_2$ and combinations thereof.

In one implementation, the seed layer gas mixture includes a boron-based precursor gas and a nitrogen-based precursor gas and optionally a hydrogen-based precursor gas. In one implementation, the boron-based precursor gas is diborane ($B_2H_6$) and the nitrogen-based precursor gas is nitrogen ($N_2$) and/or $NH_3$. The optional hydrogen-based gas is $H_2$. In some examples, inert gas, such as Ar or He may also be optionally supplied in the gas mixtures as needed.

It should be understood that the boron-based precursor gas and the nitrogen-based precursor gas used in the following description may be replaced with any of the carbon-based precursor gases, nitrogen-based precursor gases, silicon-based precursor gases, and tungsten-based precursor gases depending upon the type of seed layer deposited. In some implementations where a boron carbide seed layer is formed, the nitrogen-based precursor gas would be replaced with a carbon-based precursor gas. In some implementations where a boron carbon nitride seed layer is formed, a carbon-based precursor gas is included with either the boron-based precursor gas or the nitrogen-based precursor gas. In some implementations where a carbon nitride seed layer is formed, the boron-based precursor gas is replaced with a carbon-based precursor gas. In some implementations, where a silicon-carbide seed layer is formed, the boron-based precursor gas is replaced with a silicon-based precursor gas and the nitrogen-based precursor gas is replaced with a carbon-based precursor gas. In some implementations, where a tungsten silicide seed layer is formed, the boron-based precursor gas is replaced with a tungsten-based precursor gas and the nitrogen-based precursor gas is replaced with a silicon-based precursor gas.

In some implementations, the gas flow rates of the gases used to form the seed layer 410 are varied during the formation process in order to increase the defect density in the seed layer 410. This increased defect density in the seed layer increases the amount of fluorine that is trapped in the seed layer during deposition of subsequent layers, which promotes interface adhesion to the underlying film stack 404. In one implementation, the boron-based precursor gas supplied at operation 330 for forming the seed layer 410 is varied at between about 20 sccm and about 2000 sccm for between 2 seconds and about 30 seconds. The nitrogen-based precursor gas flow supplied at operation 330 for forming the seed layer 410 is controlled at between 100 sccm and about 5000 sccm. Alternatively, the precursors supplied in the seed layer gas mixture may be controlled at a ratio of the boron-based precursor to the nitrogen-based precursor between about 1:2 and about 1:50.

During deposition of the seed layer 410, several process parameters may be regulated the process. In one implementation suitable for processing a 300 mm substrate, the process pressure may be maintained at about 0.1 Torr to about 80 Torr, for example, about 1 Torr to about 20 Torr. In one implementation suitable for processing a 300 mm substrate, the process pressure may be increased during the process, decreased during the process, or cycled between low pressure and high pressure during the process. A RF source power between about 100 Watts and about 1000 Watts is supplied in the seed layer gas mixture. A RF bias power between about 0 Watts and about 500 Watts may be optionally supplied in the seed layer gas mixture. The spacing between the substrate and showerhead may be controlled at about 200 mils to about 1000 mils. The substrate temperature of the deposition process is maintained between about 300 degrees Celsius and about 900 degrees Celsius, such as between about 400 degrees Celsius and about 480 degrees Celsius. Deposition of the seed layer may be performed with plasma, without plasma, or partially with plasma.

Figure 5A:
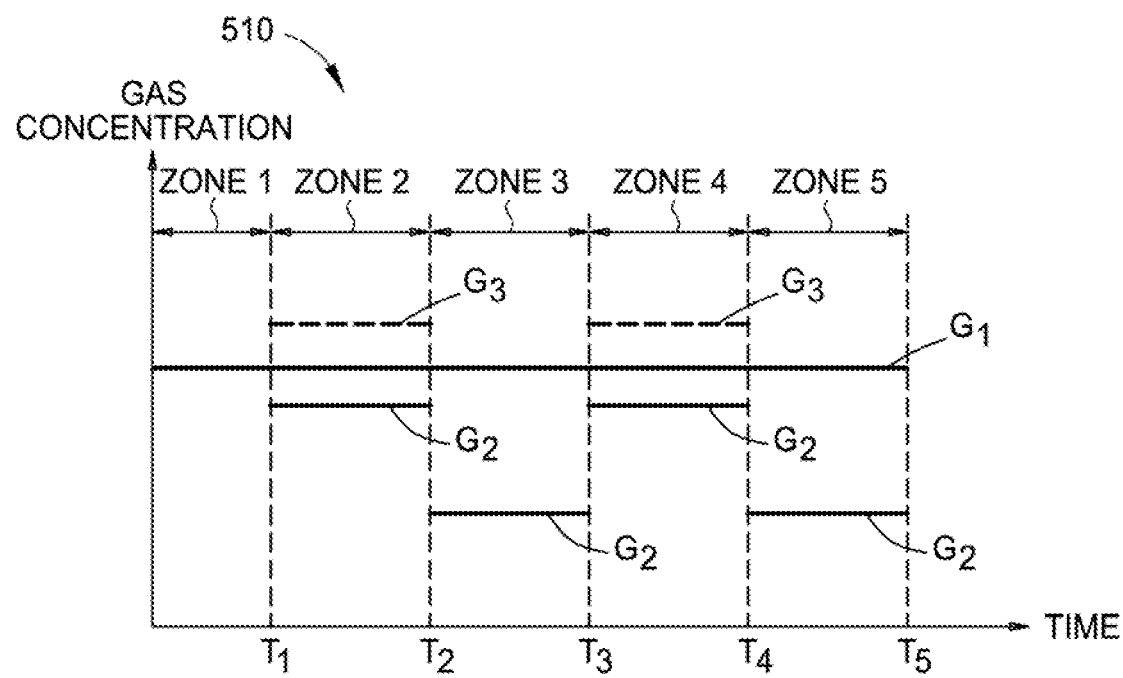
FIGS. 5A-5C depict gas flow diagrams for forming a seed layer in accordance with various embodiments of the present disclosure.

In one implementation, the boron-based precursor gas (shown as the trace line $G_2$ in FIGS. 5A-5B) and the nitrogen-based precursor gas, hydrogen gas, and/or inert gases (shown as the trace line $G_1$ in FIGS. 5A-5B), such as for example, $N_2$ and/or $NH_3$ gas, $H_2$, Ar and/or He, supplied in the seed layer deposition gas mixture may be supplied at a preset flow rate (e.g., predetermined flow value) from a first predetermined time point $T_1$ to a second predetermined time point $T_2$ during the seed layer deposition process of FIG. 5A. It is noted that the trace line $G_2$ in FIG. 5A depicts that the boron-based precursor gas is flowed at a rate less than the flow rate of the nitrogen-based precursor, gas such as the trace line $G_1$, as one example. In yet another example, the flow rate of the boron-based precursor gas, such as the dotted trace line $G_3$ in FIG. 5A, may be supplied at a flow rate greater than the flow rate of the nitrogen-based precursor gas, such as shown by the trace line $G_1$.

In one implementation, as shown in FIG. 5A, the boron-based precursor gas (shown as the trace line $G_2$ in FIG. 5A) supplied in the seed layer deposition gas mixture is supplied at a reduced flow rate from the second predetermined time point $T_2$ to a third predetermined time point $T_3$ while the gases represented by trace line $G_1$ are maintained at a constant flow rate during the seed layer deposition process of FIG. 5A. The boron-based precursor gas (shown as the trace line $G_2$ in FIG. 5A) supplied in the deposition gas mixture is supplied at an increased flow rate from the third predetermined time point $T_3$ to a fourth predetermined time point $T_4$ while the precursor gases represented by trace line $G_1$ are maintained at a constant flow rate during the seed layer deposition process indicated in time zone 4 of FIG. 5A. The boron-based precursor gas (shown as the trace line $G_2$ in FIG. 5A) supplied in the seed layer deposition gas mixture is supplied at a reduced flow rate from the fourth predetermined time point $T_4$ to a fifth predetermined time point $T_5$ while the gases represented by trace line $G_1$ are maintained at a constant flow rate during the seed layer deposition process as indicated in time zone 5 of FIG. 5A. The flow rates of the gases may be cycled until a predetermined thickness of the seed layer is achieved. The transition in gas flow rates may be achieved by either "ramp-up" or "ramp-down" of the gases or sudden change (e.g., opening or closing of a throttle valve or other valve.)

Figure 5B:
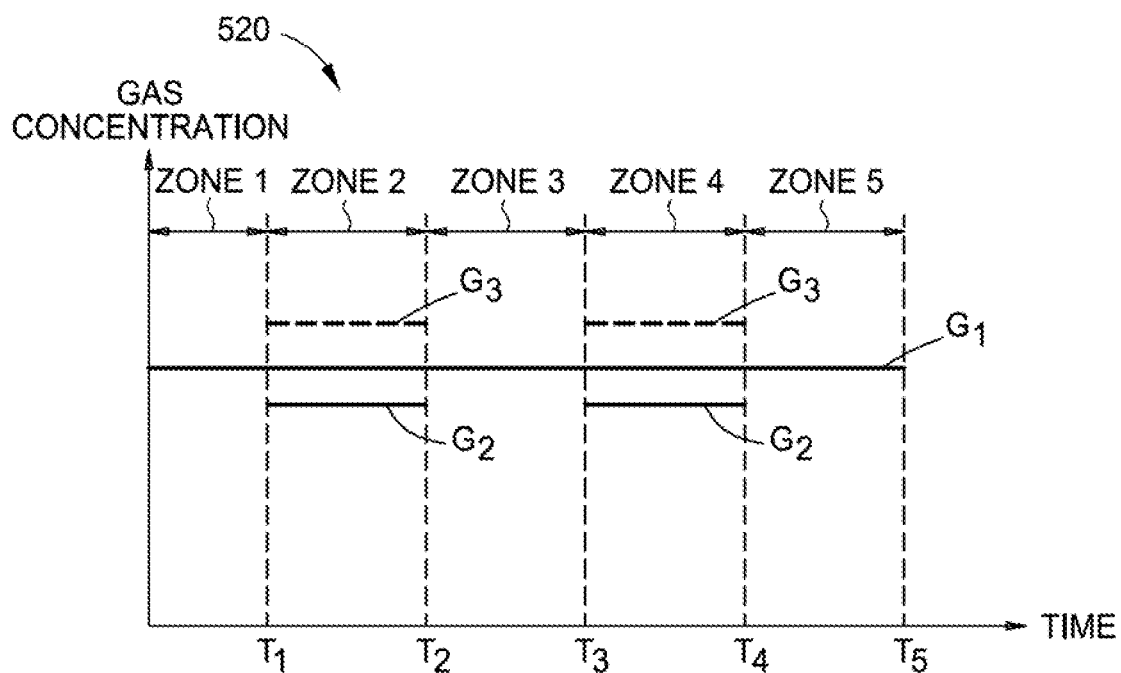

In another example, FIG. 5B depicts a gas flow diagram 520 for forming a seed layer in accordance with various implementations of the present disclosure. Gas flow diagram 520 is similar to gas flow diagram 510 except that instead of reducing the gas flow represented by trace line $G_2$ in time zone 3 and time zone 5, in the process depicted in gas flow diagram 520 the gas flow represented by trace line $G_2$ is cycled on in time zone 2 and time zone 4 and cycled off in time zone 3 and time zone 5. In one example, as shown in FIG. 5B, the boron-based precursor gas (shown as the trace line $G_2$ in FIG. 5B) supplied in the seed layer deposition gas mixture is cycled off from the second predetermined time point $T_2$ to a third predetermined time point $T_3$ while the gases represented by trace line $G_1$ are maintained at a constant flow rate during the seed layer deposition process indicated in time zone 3 of FIG. 5B. The boron-based precursor gas (shown as the trace line $G_2$ in FIG. 5B) supplied in the seed layer deposition gas mixture is cycled on from the third predetermined time point $T_3$ to a fourth predetermined time point $T_4$ while the gases represented by trace line $G_1$ are maintained at a constant flow rate during the seed layer deposition process indicated in time zone 4 of FIG. 5B. The boron-based precursor gas (shown as the trace line $G_2$ in FIG. 5B) supplied in the seed layer deposition gas mixture is cycled off from the fourth predetermined time point $T_4$ to a fifth predetermined time point $T_5$ while the gases represented by trace line $G_1$ are maintained at a constant flow rate during the seed layer deposition process indicated in time zone 5 of FIG. 5B. The flow rates of the gases may be cycled on and off until a predetermined thickness of the seed layer is achieved. The transition in gas flow rates may be achieved by either "ramp-up" or "ramp-down" of the gases or sudden change (e.g., opening or closing of a throttle valve or other valve) as shown in FIG. 5B.

Figure 5C:
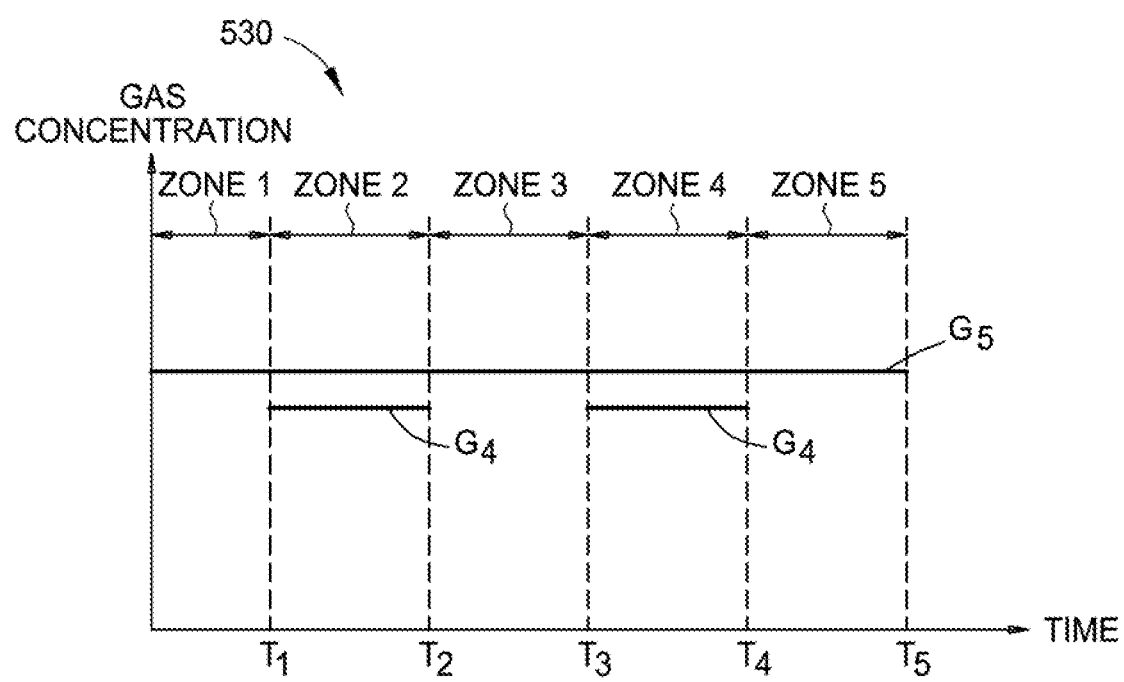

In another example, FIG. 5C depicts a gas flow diagram 530 for forming a seed layer in accordance with various implementations of the present disclosure. Gas flow diagram 530 is similar to gas flow diagram 520 except that instead of only flowing a boron-based precursor gas represented by trace line $G_3$ in FIG. 5B, the gas flow represented by trace line $G_4$ in FIG. 5C includes the boron-based precursor gas and at least one of hydrogen gas and nitrogen gas and the gas flow represented by trace line $G_5$ includes inert gas. In gas flow diagram 530, the gas flow represented by trace line $G_4$ is cycled on in time zone 2 and time zone 4 and cycled off in time zone 3 and time zone 5. In one example, as shown in FIG. 5C, the gas flow represented by trace line $G_4$ supplied in the seed layer deposition gas mixture is cycled off from the second predetermined time point $T_2$ to a third predetermined time point $T_3$ while the gases represented by trace line $G_5$ are maintained at a constant flow rate during the seed layer deposition process of FIG. 5C. The gas flow (shown as the trace line $G_4$ in FIG. 5C) supplied in the seed layer deposition gas mixture is cycled on from the third predetermined time point $T_3$ to a fourth predetermined time point $T_4$ while the gas flow represented by trace line $G_5$ is maintained at a constant flow rate during the seed layer deposition process of FIG. 5C. The gas flow (shown as the trace line $G_4$ in FIG. 5C) supplied in the seed layer deposition gas mixture is cycled off from the fourth predetermined time point $T_4$ to a fifth predetermined time point $T_5$ while the gas flow represented by trace line $G_5$ is maintained at a constant flow rate during the seed layer deposition process of FIG. 5C. The flow rates of the gases may be cycled on and off until a predetermined thickness of the seed layer is achieved. The transition in gas flow rates may be achieved by either "ramp-up" or "ramp-down" of the precursor gases or sudden change (e.g., opening or closing of a throttle valve or other valve) as shown in FIG. 5C.

FIGS. 6A-6D depict gas flow diagrams for forming a tungsten hardmask layer in accordance with various implementations of the present disclosure. In FIGS. 6A-6D, a seed layer (e.g., seed layer 410) is formed in time zone 1 (operation 330), a transition layer (e.g., transition layer 411) is formed in time zone 2 (operation 340), and a bulk hardmask layer (e.g., bulk hardmask layer 412) is formed in time zone 3 through time zone 6 (operation 350). In one implementation, the boron-based precursor gas (shown as the trace line $G_7$ in FIGS. 6A-6B) and the nitrogen-based precursor gas, hydrogen gas, and/or inert gases (shown as the trace line $G_6$ in FIGS. 6A-6B), such as for example, $N_2$ and/or $NH_3$ gas, $H_2$, Ar and/or He, supplied in the seed layer gas mixture may be supplied at a preset flow rate (e.g., predetermined flow value) for a first time-period from the beginning of the method 300 to a first predetermined time point $T_1$ during the seed layer deposition process, indicated in time zone 1 of FIG. 6A. In the time-period of time zone 1, the gas flow of the boron-based precursor gas, shown as the trace line $G_7$, and the nitrogen-based precursor gas, shown as the trace line $G_6$, remains steady when forming the seed layer 410 in the operation 330 until the seed layer 410 reaches a predetermined thickness. In one example, the seed layer 410 has a thickness between about 0.5 nm and about 100 nm. In one implementation, both the chucking voltage is maintained and the RF is on for zone 1 through zone 6 of FIGS. 6A-6D.

In one implementation, the seed layer 410 is formed at a steady rate to maintain the seed layer 410 with low defect density to promote interface adhesion to the underlying film stack 404. In one implementation, the boron-based precursor gas supplied at operation 330 for forming the seed layer 410 is controlled at between about 20 sccm and about 2000 sccm from the first predetermined time point $T_1$ for between 2 seconds and about 30 seconds. The nitrogen-based precursor gas flow supplied at operation 330 for forming the seed layer 410 is controlled at between 100 sccm and about 5000 sccm. Alternatively, the gases supplied in the seed layer gas mixture may be controlled at a ratio of the boron-based precursor gas to the nitrogen-based precursor gas between about 1:2 and about 1:50.

During deposition of the seed layer 410, several process parameters may be regulated the process. In one implementation suitable for processing a 300 mm substrate, the process pressure may be maintained at about 0.1 Torr to about 80 Torr, for example, about 1 Torr to about 20 Torr. A RF source power between about 100 Watts and about 1000 Watts is supplied in the seed layer gas mixture. A RF bias power between about 0 Watts and about 500 Watts may be optionally supplied in the seed layer gas mixture. The spacing between the substrate and showerhead may be controlled at about 200 mils to about 1000 mils. The substrate temperature of the deposition process is maintained between about 300 degrees Celsius and about 900 degrees Celsius, such as between about 400 degrees Celsius and about 480 degrees Celsius.

Although deposition of the seed layer 410 in time zone 1 of FIGS. 6A-6D is depicted as having a steady flow rate, any of the processes depicted in FIGS. 5A-5C may be used to form the seed layer.

At operation 340, after the seed layer 410 is formed on the film stack 404, a second gas mixture, such as a transition gas mixture, is supplied to the substrate surface. In one implementation, the chucking voltage supplied in operation 320 and/or operation 330 is maintained during operation 340. The processing gases supplied in the transition gas mixture may be dynamically controlled to facilitate transitioning the seed layer gas mixture to a main deposition gas mixture performed at operation 350 after the supply of the transition gas mixture is completed. After the seed layer 410 has reached to a desired thickness, in the transition gas mixture, the ratio of the boron-based precursor gas to nitrogen-based precursor gas may be changed. The transition gas mixture may include at least the gradually ramped down boron-based precursor gas and the continuously steady gas flow of nitrogen-based precursor gas from the seed layer gas mixture from operation 330. In addition to the gradually ramped-down boron-based precursor gas mixture and the steady flow of the nitrogen-based precursor gas mixture from seed layer gas mixture, a tungsten-based precursor gas may be newly introduced in the transition gas mixture at operation 340. Suitable tungsten-based precursor gases include, but are not limited to, $WF_6$, WC, $W(CO)_6$ or any suitable tungsten halide gases (such as $WX_n$, where X are halogen species including F, Cl, Br and I and n is integer between 1 and 6), organometallic tungsten precursors, and combinations thereof. In one example, the tungsten-based precursor gas supplied in the transition gas mixture is $WF_6$.

It is noted that the term "ramp-up" as used herein means gradually increasing a process parameter from a first time set point to a second time set point over a predetermined time-period with a desired ramp-up rate. The term "ramp-up" used herein is not a sudden change caused by an action of throttle or other valve opening and closing.

When supplying the transition gas mixture into the processing chamber, the tungsten-based precursor gas may be gradually ramped up from a second time-period, shown as the trace line $G_5$ in the time zone 2 from the first predetermined time point $T_1$ to a second predetermined time point $T_2$. During the time-period indicated by time zone 2, the flow of the nitrogen-based precursor gas, shown as gas trace line $G_6$ remains steady.

In operation 340, the gas supply from the seed layer gas mixture at operation 330 (e.g., zone 2 of FIGS. 6A-6C) is transitioned prior to supplying a main deposition gas mixture at operation 350 (e.g., zone 3 of FIG. 6A-6C), which will be described later below, the transition gas mixture as supplied may deposit a transition layer 411 on the seed layer 410, as shown in FIG. 4C. The transition layer 411 as formed on the seed layer 410 may have a gradient film structure with a varying atomic concentration with the growth of the transition layer 411. It is believed that the gradual ramp-up of the tungsten-based precursor gas flow and the gradual ramp-down of the boron-based precursor gas flow in the transition gas mixture may assist increasing the tungsten atomic concentration within the deposited film while gradually reducing the boron atomic concentration uniformly, thus assisting adhering and distributing the tungsten atoms on the substrate surface to react with the nitrogen atoms (e.g., constantly supply in the gas mixtures) with desirable film properties and low defect density. Further, it is believed that the gradual ramp-up of the tungsten-based precursor gas flow and the gradual ramp-down of the boron-based precursor gas flow in the transition gas mixture may provide a smooth transition, better adhesion and microstructural control. As the tungsten-based precursor gas flow is gradually ramped-up and the boron-based precursor gas flow is gradually ramped-down, the transition layer 411 formed on the substrate may be a gradient boron-tungsten-nitride (BWN) layer with a higher boron concentration (e.g., lower tungsten concentration) close to the substrate surface while with a lower boron centration (e.g., higher tungsten concentration) with the increase of the thickness of the transition layer 411. The gases supplied in the transition gas mixture may be dynamically and constantly varied and adjusted so as to allow the transition layer 411 to provide a smooth transition with different film properties (e.g., from a BN layer to a WN layer later formed in the main deposition process in operation 350). Uniform adherence of the boron, tungsten and nitrogen atoms with low defect density formed on the substrate surface provides good nucleation sites for the subsequent atoms to nucleate thereon so as to promote a desired grain structure, grain size and low film roughness. The nitrogen-based precursor gas flow supplied in the transition gas mixture may be kept steady as needed and the ramp-up of the tungsten-based precursor gas as well as the ramp-down of the boron-based precursor gas flow to form the transition layer 411 with the desired gradient film bonding structure in preparation for the main deposition process at operation 350.

Figure 6A:
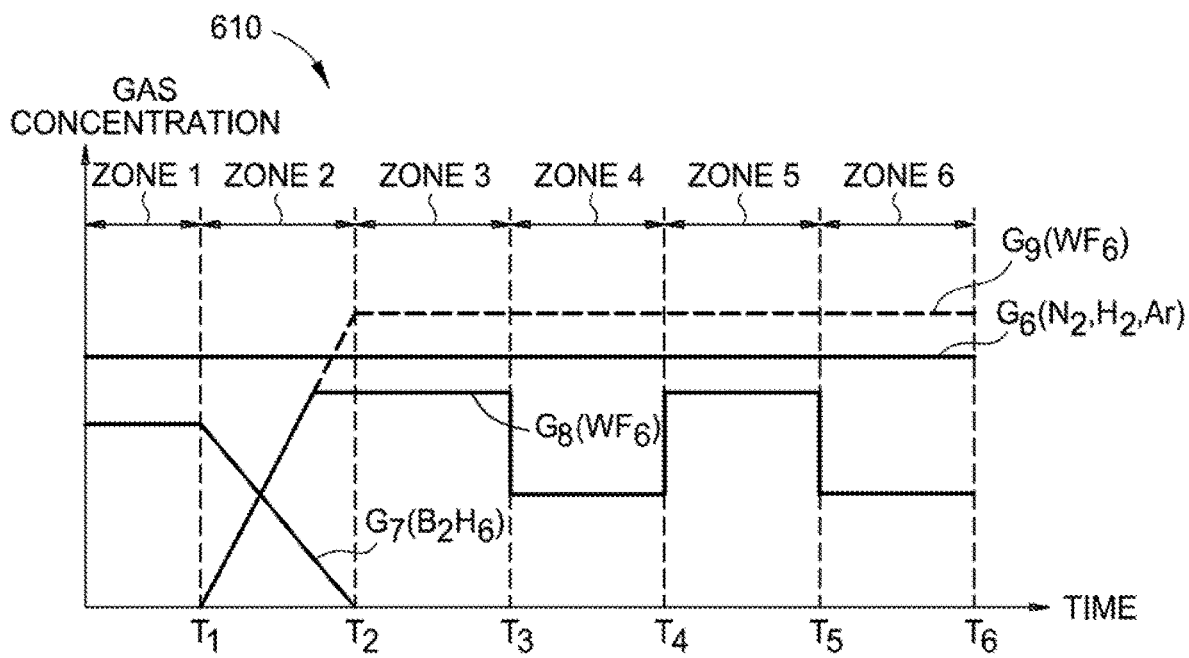
FIGS. 6A-6D depict gas flow diagrams for forming a tungsten hardmask layer in accordance with various embodiments of the present disclosure.

In one implementation, the ramp-down rate of the boron-based precursor gas supplied at operation 340 may be between about 5 sccm per second and about 500 sccm per second until the boron-based precursor gas supplied to the processing chamber is terminated at the second predetermined time point $T_2$, as shown in FIG. 6A. Similarly, the ramp-up rate of the tungsten-based precursor gas supplied at operation 340 may be between about 5 sccm per second and about 100 sccm per second until the tungsten-based precursor gas supplied to the processing chamber has reached a predetermined gas flow rate at the second predetermined time point $T_2$. The nitrogen-based precursor gas flow supplied at operation 340 for forming the transition layer 411 is kept at a steady flow rate of at between 100 sccm and about 10000 sccm. In one example, the ramp-up rate of the tungsten-based precursor gas in the transition gas mixture may be controlled similar to, greater or slower than the ramp-down rate of the boron-based precursor gas. In one specific example, the ramp-up rate of the tungsten-based precursor gas in the transition gas mixture is controlled similar to the ramp-down rate of the boron-based precursor gas.

During deposition of the transition layer 411, several process parameters may be regulated the process. In one implementation suitable for processing a 300 mm substrate, the process pressure may be maintained at about 0.1 Torr to about 80 Torr, for example, about 1 Torr to about 20 Torr. A RF source power between about 100 Watts and about 1000 Watts is supplied in the seed layer gas mixture. A RF bias power between about 0 Watts and about 500 Watts may be optionally supplied in the transition gas mixture. Deposition of the transition layer may be performed with plasma, without plasma, or partially with plasma. The spacing between the substrate and showerhead may be controlled at about 200 mils to about 1000 mils. The substrate temperature of the deposition process is maintained between about 300 degrees Celsius and about 900 degrees Celsius, such as between about 480 degrees Celsius.

Figure 4D:
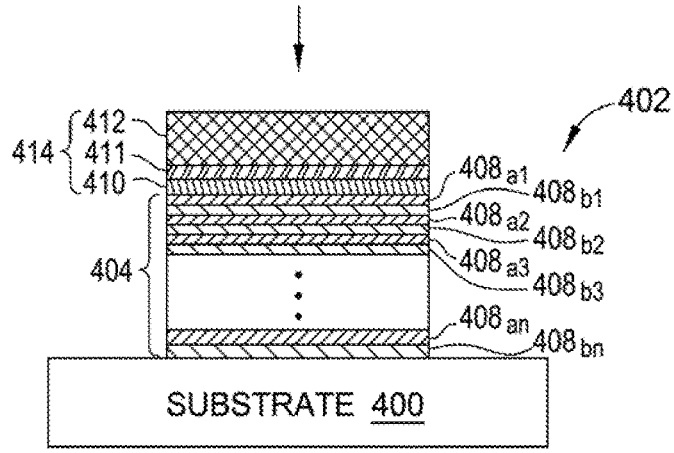

At operation 350, after the flow of transition gas mixture is terminated, a third gas mixture, such as a main deposition gas mixture, may be supplied into the processing chamber to form a bulk hardmask layer 412 on the transition layer 411, as shown in FIG. 4D. Thus, the hardmask layer 414 formed on the film stack 404 in total includes the seed layer 410, the transition layer 411 and the bulk hardmask layer 412. In some implementations, the gas flow rates of the precursors used to form the bulk hardmask layer 412 are varied during the formation process in order to increase the defect density in the bulk hardmask layer 412. This increased defect density in the seed layer increases the amount of fluorine that is trapped in the bulk hardmask layer 412 during deposition of subsequent layers, which promotes interface adhesion to the underlying film stack 404.

While forming the bulk hardmask layer 412 in time zone three for a predetermined period of time, the tungsten-based precursor gas supplied in the gas mixture may be gradually ramped-up (from the transition gas mixture at operation 340 in time zone two) until a desired gas flow rate has reached at operation 350, as shown in gas trace line $G_5$ in time zone 3 of FIG. 6A. Dynamically adjusting the gas flow ratio when performing the gas transition from the transition gas mixture at operation 340 to the main deposition gas mixture at operation 350, the bulk hardmask layer 412 may be formed having certain film properties as desired. In one implementation, the chucking voltage supplied in operation 320 is maintained during operation 350.

As the tungsten-based precursor gas (e.g., the gas trace line $G_8$) has reached a predetermined flow rate when entering into time zone 3 of operation 350, as shown in FIG. 6A, the flow rate of the tungsten-based precursor gas controlled for depositing the bulk hardmask layer 412 may be held steady as well as the nitrogen-based precursor gas (e.g., the gas trace line $G_6$) continuously supplied which switches from the transition gas mixture to the main deposition gas mixture. The main deposition gas mixture may be supplied for the second predetermined time point $T_2$ to a third predetermined time point $T_3$. In one example, the main deposition process may be performed for between about 10 seconds and about 400 seconds to form the bulk hardmask layer 412 having a thickness between about 20 nm and about 1000 nm.

In one example, the gases supplied in the main deposition gas mixture include at least the tungsten-based precursor gas and the nitrogen gas. In some implementations where the bulk hardmask layer is tungsten carbide, the nitrogen precursor gas is replaced with a carbon-based precursor gas. A hydrogen containing gas may be optionally supplied in the main deposition gas mixture as needed. In one example, the gases supplied in the main deposition gas mixture include $WF_6$, $N_2$ and/or $NH_3$ and $H_2$. In some examples, inert gas, such as Ar or He may also be optionally supplied in the main deposition gas mixture as needed. In such example, the bulk hardmask layer 412 formed on the film stack 404 is a tungsten nitride (WN) layer.

In one implementation, the tungsten-based precursor gas (shown as the trace line $G_8$ in FIG. 6A) and the nitrogen-based precursor gases gas (shown as the trace line $G_6$ in FIG. 6A), such as the $N_2$ and/or $NH_3$ gas, supplied in the deposition gas mixture may be supplied at a preset flow rate (e.g., predetermined flow value) from the second predetermined time point $T_2$ to the third predetermined time point $T_3$ during the main deposition process, indicated in time zone 3 of FIG. 6A. It is noted that the trace line $G_5$ in FIG. 6A depicts that the tungsten-based precursor gas is flowed at a rate less than the flow rate of the nitrogen-based precursor gas, such as the trace line $G_6$, as one example. In yet another example, the flow rate of the tungsten-based precursor gas, such as the dotted trace line $G_9$ in FIG. 6A, may be supplied at a flow rate greater than the flow rate of the nitrogen-based precursor gas, such as shown by the trace line $G_6$.

In one example, as shown in FIG. 6A, the tungsten-based precursor gas (shown as the trace line $G_5$ in FIG. 6A) supplied in the deposition gas mixture is supplied at a reduced flow rate from the third predetermined time point $T_3$ to a fourth predetermined time point $T_4$ while the gases represented by trace line $G_6$ are maintained at a constant flow rate during the main deposition process indicated in time zone 4 of FIG. 6A. The tungsten-based precursor gas (shown as the trace line $G_5$ in FIG. 6A) supplied in the deposition gas mixture is supplied at an increased flow rate from the fourth predetermined time point $T_4$ to a fifth predetermined time point $T_5$ while the gases represented by trace line $G_6$ are maintained at a constant flow rate during the main deposition process indicated in time zone 5 of FIG. 6A. The tungsten-based precursor gas (shown as the trace line $G_5$ in FIG. 6A) supplied in the deposition gas mixture is supplied at a reduced flow rate from the fifth predetermined time point $T_5$ to a sixth predetermined time point $T_6$ while the gases represented by trace line $G_6$ are maintained at a constant flow rate during the main deposition process indicated in time zone 6 of FIG. 6A. The flow rates of the gases may be cycled until a predetermined thickness of the bulk hardmask layer is achieved. The transition in gas flow rates may be achieved by either "ramp-up" or "ramp-down" of the gases or sudden change (e.g., opening or closing of a throttle valve or other valve.)

Figure 6B:
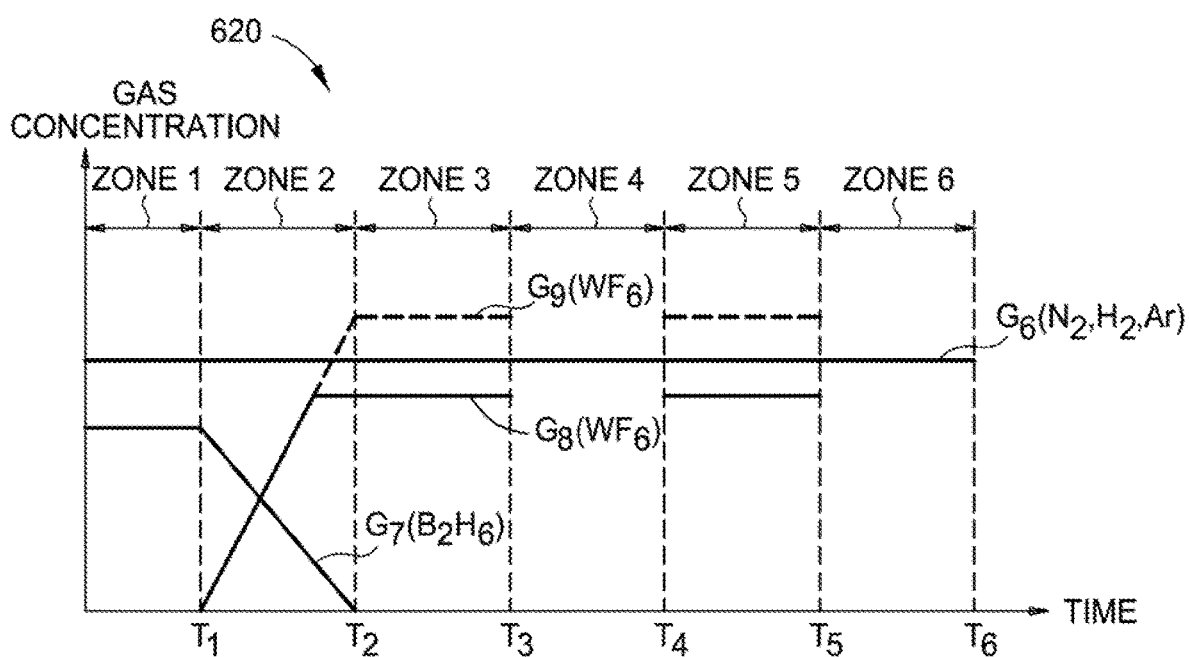

FIG. 6B depicts a gas flow diagram 620 for forming a tungsten hardmask layer in accordance with various embodiments of the present disclosure. Gas flow diagram 620 is similar to gas flow diagram 610 except that instead of reducing the gas flow represented by trace line $G_5$ in time zone 4 and time zone 6, in the process depicted in gas flow diagram 620 the gas flow represented by trace line $G_5$ is cycled on in time zone 3 and time zone 5 and cycled off in time zone 4 and time zone 6. In one example, as shown in FIG. 6B, the tungsten-based precursor gas (shown as the trace line $G_8$ in FIG. 6B) supplied in the deposition gas mixture is cycled off from the third predetermined time point $T_3$ to a fourth predetermined time point $T_4$ while the gases represented by trace line $G_6$ are maintained at a constant flow rate during the main deposition process indicated in time zone 4 of FIG. 6B. The tungsten-based precursor gas (shown as the trace line $G_8$ in FIG. 6B) supplied in the deposition gas mixture is cycled on from the fourth predetermined time point $T_4$ to a fifth predetermined time point $T_5$ while the gases represented by trace line $G_6$ are maintained at a constant flow rate during the main deposition process indicated in time zone 5 of FIG. 6B. The tungsten-based precursor gas (shown as the trace line $G_8$ in FIG. 6A) supplied in the deposition gas mixture is cycled off from the fifth predetermined time point $T_5$ to a sixth predetermined time point $T_6$ while the gases represented by trace line $G_6$ are maintained at a constant flow rate during the main deposition process indicated in time zone 6 of FIG. 6B. The flow rates of the gases may be cycled on and off until a predetermined thickness of the bulk hardmask layer is achieved. The transition in gas flow rates may be achieved by either "ramp-up" or "ramp-down" of the gases or sudden change (e.g., opening or closing of a throttle valve or other valve) as shown in FIG. 6B.

Figure 6C:
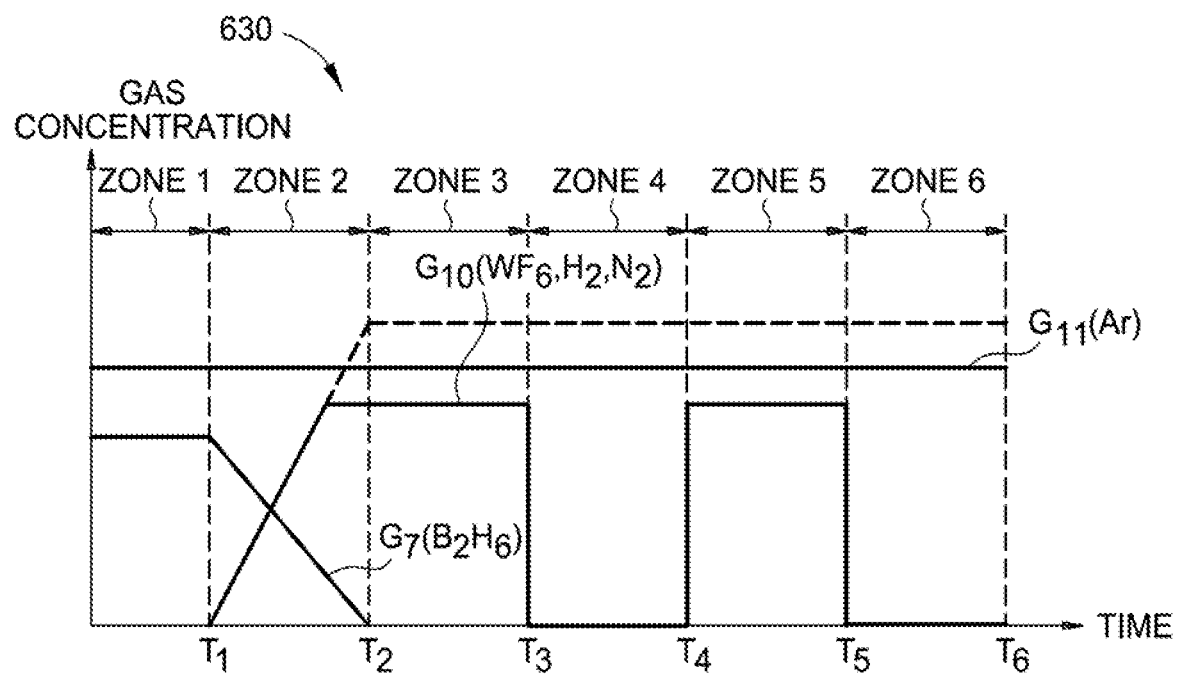

FIG. 6C depicts a gas flow diagram 630 for forming a tungsten hardmask layer in accordance with various embodiments of the present disclosure. Gas flow diagram 630 is similar to gas flow diagram 620 except that instead of only flowing tungsten-based precursor gas represented by trace line $G_e$ in FIGS. 6A-6B, the gas flow represented by trace line $G_{10}$ includes the tungsten-based precursor gas and at least one of hydrogen gas and nitrogen gas and the gas flow represented by trace line $G_{11}$ includes in inert gas only. In gas flow diagram 630, the gas flow represented by trace line $G_{10}$ is cycled on in time zone 3 and time zone 5 and cycled off in time zone 4 and time zone 6. In one example, as shown in FIG. 6C, the gas flow represented by trace line $G_{10}$ supplied in the deposition gas mixture is cycled off from the third predetermined time point $T_3$ to a fourth predetermined time point $T_4$ while the gases represented by trace line $G_{11}$ are maintained at a constant flow rate during the main deposition process indicated in time zone 4 of FIG. 6C. The gas flow (shown as the trace line $G_{10}$ in FIG. 6C) supplied in the deposition gas mixture is cycled on from the fourth predetermined time point $T_4$ to a fifth predetermined time point $T_5$ while the gas flow represented by trace line $G_{11}$ is maintained at a constant flow rate during the main deposition process indicated in time zone 5 of FIG. 6C. The gas flow (shown as the trace line $G_{10}$ in FIG. 6C) supplied in the deposition gas mixture is cycled off from the fifth predetermined time point $T_5$ to a sixth predetermined time point $T_6$ while the gas flow represented by trace line $G_{11}$ is maintained at a constant flow rate during the main deposition process indicated in time zone 6 of FIG. 6C. The flow rates of the gases may be cycled on and off until a predetermined thickness of the bulk hardmask layer is achieved. The transition in gas flow rates may be achieved by either "ramp-up" or "ramp-down" of the gases or sudden change (e.g., opening or closing of a throttle valve or other valve) as shown in FIG. 6C.

Figure 6D:
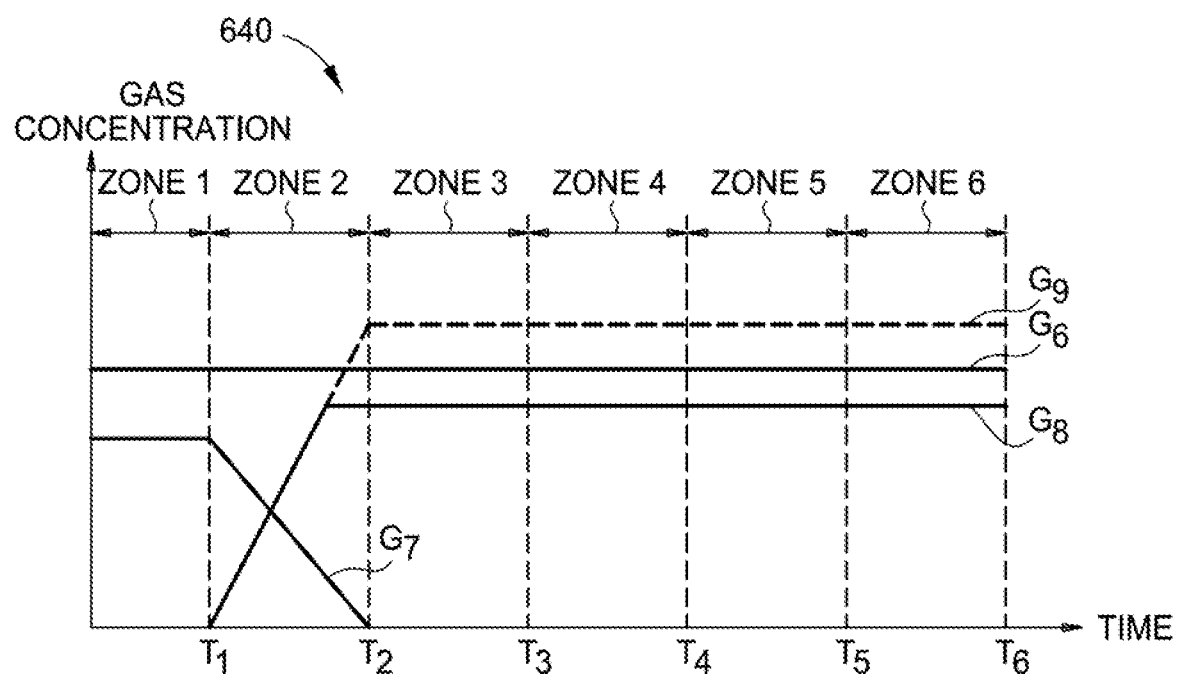

FIG. 6D depicts a gas flow diagram 640 for forming a tungsten hardmask layer in accordance with various embodiments of the present disclosure. Gas flow diagram 640 is similar to gas flow diagram 620 except that the flow rate of the tungsten-based precursor gas represented by trace line G8 is constant through zone 3 to zone 6. The flow rates of the gases may be cycled on and off until a predetermined thickness of the bulk hardmask layer is achieved. The transition in gas flow rates may be achieved by either "ramp-up" or "ramp-down" of the gases or sudden change (e.g., opening or closing of a throttle valve or other valve) as shown in FIG. 6D.

In some implementations, the bulk hardmask layer 412 is formed at a steady rate to maintain the bulk hardmask layer 412 with low defect density while bridging from the transition layer 411. In one implementation, the tungsten-based precursor gas supplied at operation 350 for forming the bulk hardmask layer 412 is controlled at between about 50 sccm and about 500 sccm. The nitrogen-based precursor gas flow supplied at operation 350 for forming the bulk hardmask layer 412 is controlled at between 500 sccm and about 10000 sccm. Alternatively, the gases supplied in the main deposition gas mixture may be controlled at a ratio of the tungsten-based precursor gas to the nitrogen-based precursor gas between about 1:2 and about 1:50.

During deposition of the bulk hardmask layer 412, several process parameters may be regulated. In one implementation suitable for processing a 300 mm substrate, the process pressure may be maintained at about 0.1 Torr to about 80 Torr, for example, about 1 Torr to about 20 Torr. A RF source power between about 100 Watts and about 1000 Watts is supplied in the main deposition gas mixture. A RF bias power between about 0 Watts and about 500 Watts may be optionally supplied in the main deposition gas mixture. Deposition of the bulk hardmask layer may be performed with plasma, without plasma, or partially with plasma. The spacing between the substrate and showerhead may be controlled at about 200 mils to about 1000 mils. The substrate temperature of the deposition process is maintained between about 300 degrees Celsius and about 900 degrees Celsius, such as between about 480 degrees Celsius.

It is noted that the stress level of the bulk hardmask layer 412 may be adjusted by adjusting the RF bias power supplied during the main deposition process at operation 350. When the RF bias power is supplied at a higher level, a more compressive film of the bulk hardmask layer 412 may be obtained. In contrast, the RF bias power is supplied at a lower level, a more tensile film of the bulk hardmask layer 412 may be obtained.

In one example, the overall hardmask layer 414 (including the seed layer 410, the transition layer 411 and the bulk hardmask layer 412) may be in combination having a stress range between about −100 MPa and about +1000 MPa. It is believed that the seed layer 410 and the transition layer 411 formed in the hardmask layer 414 may assist providing a smooth film structure transition as well as providing a good adhesion to the substrate surface. The smooth film structure transition (e.g., predominately contributed from the transition layer 411) formed in the hardmask layer 414 may assist maintaining the hardmask layer 414 with minimum surface roughness, such as a surface roughness less than 1 nm Ra. Furthermore, grain sizes of the hardmask layer 414 may also be controlled, such as grain sizes less than 15 Å, to provide a good etching selectivity to serve as a mask layer during an etching/patterning process.

At operation 360, after the hardmask layer 414 is formed on the substrate, the substrate is de-chucked. During operation 360, the chucking voltage is turned-off. The reactive gases are turned-off and optionally purged from the processing chamber. In one implementation, during operation 360 RF power is reduced (e.g., ~200 W). Optionally, the system controller 175 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of chamber.

After the hardmask layer 414 is formed on the substrate, the hardmask layer 414 may be utilized in an etching process as a patterning mask to form a three-dimensional structure, such as a stair like structure.

Thus, methods and apparatus for forming a hardmask layer that may be utilized to form stair-like structures for manufacturing three-dimensional stacking of semiconductor devices are provided. The hardmask layer may include a seed layer, transition layer and a bulk hardmask layer that provide a bonding structure with low surface roughness and high adhesion at the interface. By utilization of the hardmask layer with desired robust film properties and etching selectivity, an improved dimension and profile control of the resultant structures formed in a film stack may be obtained and the electrical performance of the chip devices may be enhanced in applications for three-dimensional stacking of semiconductor devices.

In summary, some of the benefits of the present disclosure provide a process for depositing thick hardmask films on a substrate. The implementations described herein enable deposition of thick tungsten hardmask films (e.g., 100 nanometers or greater) on high compressive or tensile bow substrates using electrostatic chucking method and alternating PECVD methods. The thick tungsten hardmask films described herein may be doped, for example, with boron, carbon, nitrogen and/or silicon. In some implementations, the application of electrostatic chucking eliminates use of a shadow ring during RF-based deposition and prevents backside deposition, while ensuring sufficient adhesion at edge and bevel. In some implementations, alternating PECVD techniques are implemented to limit seed thickness, for example, below 100 angstroms, to enhance material uniformity, while reducing technical difficulty during subsequent etch processes. Additional benefits include improved fluorine trapping, which results in reduced peeling at film interfaces.

When introducing elements of the present disclosure or exemplary aspects or implementation(s) thereof, the articles "a," "an," "the" and "said" are intended to mean that there are one or more of the elements.

While the foregoing is directed to implementations of the present disclosure, other and further implementations of the disclosure may be devised without departing from the basic scope thereof, and the scope thereof is determined by the claims that follow.

The invention claimed is:

1. A method of forming a hardmask layer on a substrate comprising:
applying a chucking voltage to a substrate positioned on an electrostatic chuck in a processing chamber;
forming a seed layer comprising boron on a film stack disposed on the substrate by supplying a seed layer gas mixture in the processing chamber while maintaining the chucking voltage, wherein the seed layer gas mixture comprises at least a boron-based precursor gas and a nitrogen-based precursor gas;
forming a transition layer comprising boron and tungsten on the seed layer by supplying a transition layer gas mixture in the processing chamber, wherein supplying the transition layer gas mixture comprises:
ramping down a gas flow rate of the boron-based precursor gas while maintaining a steady gas flow rate of the nitrogen-based precursor gas; and
supplying a tungsten-based precursor gas; and
forming a bulk hardmask layer on the transition layer by supplying a main deposition gas mixture in the processing chamber.

2. The method of claim 1, wherein the chucking voltage is between about 10 volts and about 3,000 volts.

3. The method of claim 2, wherein the chucking voltage is between about 200 volts and about 1,000 volts.

4. The method of claim 3, wherein the seed layer comprising boron is formed in the presence of a plasma.

5. The method of claim 4, wherein the plasma is formed in-situ.

6. The method of claim 5, wherein the plasma is formed using mixed frequency RF.

7. The method of claim 1, wherein forming the seed layer is performed without a shadow ring encircling a perimeter of the substrate.

8. The method of claim 1, wherein the film stack comprises repeating layers of a first dielectric layer and a second dielectric layer.

9. The method of claim 8, wherein the first dielectric layer is a silicon oxide layer and the second dielectric layer is a silicon nitride layer.

10. The method of claim 1, wherein a gas flow rate of the tungsten-based precursor gas is ramped up at a ramp up rate in the transition layer gas mixture while the gas flow rate of the boron-based precursor gas is ramped down.

11. The method of claim 10, wherein the tungsten-based precursor gas is ramped up at a rate similar to the ramp down rate of the boron-based precursor gas.

12. The method of claim 11, wherein forming the bulk hardmask layer further comprises:
steadily supplying the tungsten-based precursor gas and the nitrogen-based precursor gas in the processing chamber.

13. The method of claim 1, wherein the boron-based precursor gas is $B_2H_6$ and the nitrogen-based precursor gas is at least one of $N_2$ and $NH_3$.

14. A method of forming a hardmask layer on a substrate comprising:
applying a chucking voltage to a substrate positioned on an electrostatic chuck in a processing chamber;
forming a seed layer comprising boron on a film stack disposed on the substrate by:
supplying a seed layer gas mixture in the processing chamber while maintaining the chucking voltage, wherein the seed layer gas mixture comprises at least a boron-based precursor gas and a nitrogen-based precursor gas; and
steadily supplying the nitrogen-based precursor gas and varying a flow of the boron-based precursor gas in the processing chamber to form the seed layer;
forming a transition layer comprising boron and tungsten on the seed layer by supplying a transition layer gas mixture in the processing chamber, wherein supplying the transition layer gas mixture comprises:
ramping down a gas flow rate of the boron-based precursor gas while maintaining a steady gas flow rate of the nitrogen-based precursor gas; and
supplying a tungsten-based precursor gas; and
forming a bulk hardmask layer on the transition layer by supplying a main deposition gas mixture in the processing chamber.

15. The method of claim 14, wherein forming the bulk hardmask layer further comprises:
steadily supplying the tungsten-based precursor gas and a carbon-based precursor gas in the processing chamber.

16. The method of claim 15, wherein forming the seed layer further comprises supplying a hydrogen-based precursor gas into the processing chamber.

17. The method of claim 16, wherein the film stack is used to form stair-like structures to form three dimension NAND memory devices.

18. The method of claim 14, wherein the film stack comprises repeating layers of a silicon oxide layer and a silicon nitride layer.

19. A method of forming a hardmask layer on a substrate comprising:
applying a chucking voltage to a substrate positioned on an electrostatic chuck in a processing chamber;
forming a boron nitride layer on a film stack disposed on the substrate by supplying a seed layer gas mixture in the processing chamber while maintaining the chucking voltage, wherein the seed layer gas mixture comprises at least a boron-based precursor gas and a nitrogen-based precursor gas;
forming a boron tungsten nitride layer on the boron nitride layer by supplying a transition layer gas mixture in the processing chamber, wherein supplying the transition layer gas mixture comprises:
ramping down a gas flow rate of the boron-based precursor gas while maintaining a steady gas flow rate of the nitrogen-based precursor gas; and
supplying a tungsten-based precursor gas; and
forming a tungsten nitride layer on the boron nitride layer by supplying a main deposition gas mixture in the processing chamber.

20. The method of claim 13, wherein the tungsten-based precursor gas is $WF_6$.

* * * * *

UNITED STATES PATENT AND TRADEMARK OFFICE
CERTIFICATE OF CORRECTION

PATENT NO. : 10,504,727 B2
APPLICATION NO. : 15/695180
DATED : December 10, 2019
INVENTOR(S) : Jiarui Wang et al.

Page 1 of 1

It is certified that error appears in the above-identified patent and that said Letters Patent is hereby corrected as shown below:

In the Specification

In Column 3, Line 58, delete "SiO2," and insert -- $SiO_2$, --, therefor.

In Column 5, Line 34, delete "$C_4H_6$," and insert -- $C_4H_8$, --, therefor.

In Column 17, Line 31, delete "$G_5$" and insert -- $G_8$ --, therefor.

In Column 17, Line 39, delete "FIG." and insert -- FIGS. --, therefor.

In Column 19, Line 8, delete "$G_5$" and insert -- $G_8$ --, therefor.

In Column 20, Line 58, delete "$G_e$" and insert -- $G_8$ --, therefor.

In Column 21, Line 27, delete "G8" and insert -- $G_8$ --, therefor.

Signed and Sealed this
Twenty-fifth Day of February, 2020

Andrei Iancu
*Director of the United States Patent and Trademark Office*